United States Patent
Wu et al.

(10) Patent No.: US 11,211,419 B2
(45) Date of Patent: Dec. 28, 2021

(54) COMPOSITE BSI STRUCTURE AND METHOD OF MANUFACTURING THE SAME

(71) Applicant: Taiwan Semiconductor Manufacturing Co., Ltd., Hsin-Chu (TW)

(72) Inventors: Wei Chuang Wu, Tainan (TW); Dun-Nian Yaung, Taipei (TW); Feng-Chi Hung, Chu-Bei (TW); Jen-Cheng Liu, Hsin-Chu (TW); Jhy-Jyi Sze, Hsin-Chu (TW); Keng-Yu Chou, Kaohsiung (TW); Yen-Ting Chiang, Tainan (TW); Ming-Hsien Yang, Taichung (TW); Chun-Yuan Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/521,876

(22) Filed: Jul. 25, 2019

(65) Prior Publication Data

US 2020/0058684 A1     Feb. 20, 2020

Related U.S. Application Data

(60) Provisional application No. 62/764,964, filed on Aug. 15, 2018.

(51) Int. Cl.
    *H01L 27/146*      (2006.01)

(52) U.S. Cl.
CPC ...... *H01L 27/1463* (2013.01); *H01L 27/1464* (2013.01); *H01L 27/14603* (2013.01); *H01L 27/14683* (2013.01)

(58) Field of Classification Search
CPC ........... H01L 27/1463; H01L 27/14603; H01L 27/1464; H01L 27/14683;
(Continued)

(56) References Cited

U.S. PATENT DOCUMENTS

2015/0372034 A1    12/2015   Chen et al.
2016/0112614 A1*    4/2016   Masuda ............. H01L 31/0203
                                                                  348/374
(Continued)

*Primary Examiner* — Calvin Y Choi
(74) *Attorney, Agent, or Firm* — Eschweiler & Potashnik, LLC

(57) ABSTRACT

Various embodiments of the present application are directed towards image sensors including composite backside illuminated (CBSI) structures to enhance performance. In some embodiments, a first trench isolation structure extends into a backside of a substrate to a first depth and comprises a pair of first trench isolation segments. A photodetector is in the substrate, between and bordering the first trench isolation segments. A second trench isolation structure is between the first trench isolation segments and extends into the backside of the substrate to a second depth less than the first depth. The second trench isolation structure comprises a pair of second trench isolation segments. An absorption enhancement structure overlies the photodetector, between the second trench isolation segments, and is recessed into the backside of the semiconductor substrate. The absorption enhancement structure and the second trench isolation structure collectively define a CBSI structure.

20 Claims, 37 Drawing Sheets

(58) Field of Classification Search
CPC .......................... H01L 27/14625–14629; H01L 27/146–14893; H01L 21/823406; H01L 29/765–76891; H01L 27/1057; H01L 29/66946–66962; H01L 27/14812; H01L 27/14689
USPC ....................................................... 257/446
See application file for complete search history.

(56) References Cited

U.S. PATENT DOCUMENTS

| | | |
|---|---|---|
| 2017/0104020 A1 | 4/2017 | Lee et al. |
| 2017/0117309 A1 | 4/2017 | Chen et al. |
| 2018/0151759 A1* | 5/2018 | Huang .............. H01L 27/14629 |
| 2018/0182806 A1 | 6/2018 | Jin et al. |
| 2018/0359434 A1 | 12/2018 | Tanaka et al. |

* cited by examiner

COMPOSITE BSI STRUCTURE AND METHOD OF MANUFACTURING THE SAME

REFERENCE TO RELATED APPLICATION

This Application claims priority to U.S. Provisional Application No. 62/764,964, filed on Aug. 15, 2018, the contents of which are hereby incorporated by reference in their entirety.

BACKGROUND

Integrated circuits (ICs) with image sensors are used in a wide range of modern-day electronic devices, such as, for example, cameras and cell phones. In recent years, complementary metal-oxide semiconductor (CMOS) image sensors have begun to see widespread use, largely replacing charge-coupled device (CCD) image sensors. Compared to CCD image sensors, CMOS image sensors are favored due to low power consumption, small size, fast data processing, a direct output of data, and low manufacturing cost. One type of CMOS image sensor is a backside illuminated (BSI) CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
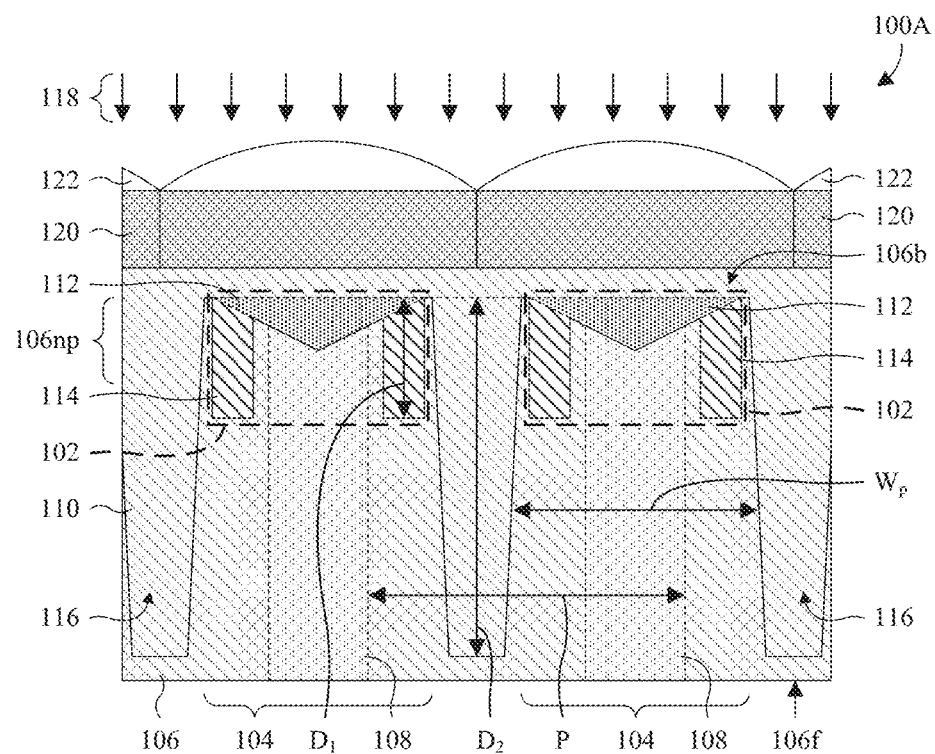
FIGS. 1A and 1B illustrate cross-sectional views of various embodiments of image sensors comprising composite backside illuminated (CBSI) structures to enhance performance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor comprises a semiconductor substrate, and further comprises an array of pixel sensors in the semiconductor substrate. The pixel sensors comprise respective photodetectors buried in the semiconductor substrate, and further comprise respective pixel transistors arranged on a surface of the semiconductor substrate. The photodetectors are configured to absorb incident radiation and to generate an electric signal corresponding to the incident radiation.

Often, but not always, the semiconductor substrate is or comprises monocrystalline silicon due to the low cost and pervasiveness of monocrystalline silicon wafers in the semiconductor industry. However, monocrystalline silicon has a low absorption coefficient for high wavelength radiation, which includes, but is not limited to, near infrared radiation (NIR) and infrared radiation. As a result, the photodetectors have low quantum efficiency for high wavelength radiations and the CMOS image sensor may be unsuitable for use with high wavelength radiation. Additionally, the semiconductor industry continuously strives to reduce pixel pitch and increase pixel density. However, as pixel pitch decreases, optical performance degrades since the pixel sensors have reduced area for absorption of radiation. Therefore, the semiconductor industry is trending in a direction that exacerbates the challenges associated with the CMOS image sensor based on monocrystalline silicon.

Various embodiments of the present application are directed to an image sensor comprising a plurality of pixel sensors with composite backside illuminated (CBSI) structures for enhanced performance. In some embodiments, the image sensor comprises a substrate, a first trench isolation structure, a photodetector, a second trench isolation structure, and an absorption enhancement structure. The first trench isolation structure extends into a backside of a substrate to a first depth and comprises a pair of first trench isolation segments. The photodetector is in the substrate, between and bordering the first trench isolation segments. The second trench isolation structure is between the first trench isolation segments and extends into the backside of the substrate to a second depth less than the first depth. The second trench isolation structure comprises a pair of second trench isolation segments. An absorption enhancement structure overlies the photodetector, between the second trench isolation segments, and is recessed into the backside of the semiconductor substrate. The absorption enhancement structure and the second trench isolation structure collectively define a CBSI structure.

The CBSI structure allows radiation to enter the substrate unimpeded and serves as a reflector for the radiation once the radiation has entered the substrate. This may, for example, be achieved by total internal reflection (TIR) in embodiments in which the CBSI structure is or comprises a material with a refractive index less than that of the substrate. By reflecting the radiation, the second trench isolation structure prevents the radiation from passing from the photodetector to a neighboring photodetector and hence reduces crosstalk. Further, the second trench isolation structure reflects the radiation back to the photodetector and hence increases absorption of the radiation. The absorption enhancement structure similarly reflects the radiation back to the photodetector and hence increase absorption of the radiation. However, the absorption enhancement structure is focused on portions of the radiation that have passed through the substrate unabsorbed and have been reflected back towards the backside of the substrate (e.g., by an underlying interconnect structure). Angled sidewalls of the absorption enhancement structure may, for example, increase the likelihood of TIR, thereby enhancing reflectance and increasing the amount of radiation reflected to the photodetector.

With reference to FIG. 1A, a cross-sectional view 100A of some embodiments of an image sensor comprising CBSI structures 102 for improved image performance is provided. The image sensor may, for example, be a backside illuminated (BSI) CMOS image sensor or some other suitable image sensor. Multiple pixel sensors 104 are on a frontside 106f of a semiconductor substrate 106, and the pixel sensors 104 comprise individual photodetectors 108 in the semiconductor substrate 106. The semiconductor substrate 106 may be or comprise, for example, a bulk silicon substrate, a silicon-on-insulator (SOI) substrate, or some other suitable semiconductor substrate. The pixel sensors 104 may be, for example, active pixel sensors (APSs) or some other suitable pixel sensors, and the photodetectors 108 may, for example, be or comprise photodiodes or some other suitable photodetectors. In some embodiments, a pitch P of the pixel sensors 104 is about 0.5-4.4 micrometers, about 0.4-2.45 micrometers, or about 2.45-4.4 micrometers. In some embodiments, a width $W_p$ of the pixel sensors 104 is about 0.8 micrometers, 0.9 micrometers, 1 micrometer, 1.1 micrometers, or about 0.8-1.1 micrometers. Other pitches and/or widths are, however, amenable for the pixel sensors 104.

The CBSI structures 102 are individual to the pixel sensors 104 and overlie the pixel sensors 104 on a backside 106b of the semiconductor substrate 106. Further, the CBSI structures 102 are part of a backside dielectric layer 110 on the backside 106b of the semiconductor substrate 106 and comprise individual absorption enhancement structures 112 and individual intra-pixel trench isolation structures 114. For illustrative purposes, the hashing has been varied between the absorption enhancement structures 112, the intra-pixel trench isolation structures 114, and a remainder of the backside dielectric layer 110. Notwithstanding the change in hashing, it should be appreciated that the absorption enhancement structures 112 and the intra-pixel trench isolation structures 114 are still part of the backside dielectric layer 110. The backside dielectric layer 110 may be or comprise, for example, silicon oxide, a high k dielectric, some other suitable dielectric(s), or any combination of the foregoing. A high k dielectric may, for example, be a dielectric with a dielectric constant greater than about 3.9, 10, or 20.

The absorption enhancement structures 112 protrude into the backside 106b of the semiconductor substrate 106 and have angled sidewalls. In some embodiments, the absorption enhancement structures 112 adjoin the photodetectors 108 and/or have bottom profiles that are triangular. Other bottom profiles are, however, amenable. The intra-pixel trench isolation structures 114 adjoin the absorption enhancement structures 112 and protrude into the backside 106b of the semiconductor substrate 106 to a first depth $D_1$. The first depth $D_1$ may, for example, be or comprise 0.1-3.0 micrometers, about 0.10-1.55 micrometers, about 1.55-3.0 micrometers, about 0.5 micrometers, or about 0.55 micrometers. Other suitable values are, however, amenable for the first depth $D_1$. The intra-pixel trench isolation structures 114 comprise individual pairs of intra-pixel trench isolation segments (not individually labeled), and the absorption enhancement structures 112 are between the intra-pixel trench isolation segments of corresponding pairs.

An inter-pixel trench isolation structure 116 separates the pixel sensors 104 from each other and is part of the backside dielectric layer 110. Further, the inter-pixel trench isolation structure 116 protrudes into the backside 106b of the semiconductor substrate 106 to a second depth $D_2$. The second depth $D_2$ is greater than the first depth $D_1$ and may, for example, be about 1-5 micrometers, about 1-3 micrometers, about 3-5 micrometers, about 1.5 micrometers, or about 2 micrometers. Other suitable values are, however, amenable for the second depth $D_2$.

During operation of the image sensor, the image sensor receives radiation 118 from the backside 106b of the semiconductor substrate 106. The radiation 118 may, for example, be or comprise high wavelength radiation or other suitable radiation. The high wavelength radiation includes 850 nanometer radiation and 940 nanometer radiation (collectively NIR radiation) and/or radiation with wavelengths in excess of about 850 or 940 nanometers. The radiation 118 impinges on and is absorbed by the photodetectors 108, thereby generating electrical signals that allow imaging. The CBSI structures 102 and the inter-pixel trench isolation structure 116 reduce cross talk between the pixel sensors 104 and increase absorption of the radiation 118, thereby enhancing quantum efficiency and performance of the image sensor. Supposing the width $W_p$ of the pixel sensors 104 is about one micrometer, simulations indicate that the CBSI structures 102 may, for example, enhance quantum efficiency by about 3.3% and about 0.3% respectively for 850 nanometer radiation and 940 nanometer radiation compared to an image sensor without the intra-pixel trench isolation structures 114.

The CBSI structures 102 allow the radiation 118 to enter the semiconductor substrate 106 unimpeded and serve as reflectors for the radiation 118 once the radiation 118 has entered the semiconductor substrate 106. This may, for example, be achieved by TIR in embodiments in which the CBSI structures 102 are or comprise a material with a refractive index less than that of the semiconductor substrate 106. For example, the CBSI structures 102 may be or comprise silicon oxide and the semiconductor substrate 106 may be or comprise monocrystalline silicon since silicon oxide has a refractive index less than that of monocrystalline silicon. Pursuant to Snell's Law, TIR occurs at the CBSI structures 102 for portions of the radiation 118 traveling from the semiconductor substrate 106 to the CBSI structures 102 but does not occur for portions of the radiation 118 traveling from the CBSI structures 102 to the semiconductor substrate 106.

By reflecting the radiation 118, the intra-pixel trench isolation structures 114 prevent the radiation 118 from passing between the pixel sensors 104 and hence reduce crosstalk. Further, the intra-pixel trench isolation structures 114 reflect the radiation 118 back to the photodetectors 108 and hence increase absorption of the radiation 118. The absorption enhancement structures 112 similarly reflect the radiation 118 back to the photodetectors 108 and hence increase absorption of the radiation 118. However, the absorption enhancement structures 112 are focused on portions of the radiation 118 that have passed through the semiconductor substrate 106 unabsorbed and have been reflected back towards the backside 106b of the semiconductor substrate 106 from an underlying interconnect structure (not shown). The slanted sidewalls of the absorption enhancement structures 112 may, for example, increase the likelihood of TIR for these portions of the radiation 118.

In some embodiments, the semiconductor substrate 106 comprises a nanoporous layer 106np along the backside 106b of the semiconductor substrate 106 to further enhance absorption of the radiation 118. The nanoporous layer 106np has a comparatively high concentration of nanopores relative to a remainder of the semiconductor substrate 106 and may, for example, be or comprise nanoporous silicon or some other suitable material. The high concentration of nanopores effectively reduces the bandgap of the nanoporous layer 106np and hence increases the absorption coefficient of the semiconductor substrate 106 along the backside 106b of the semiconductor substrate 106 and at the absorption enhancement structures 112.

Similar to the CBSI structures 102, the inter-pixel trench isolation structure 116 serves as a reflector for the radiation 118. Reflectance may, for example, be achieved by TIR in embodiments in which the inter-pixel trench isolation structure 116 is or comprise a material with a refractive index less than that of the semiconductor substrate 106. Additionally, or alternatively, reflectance may be achieved by a reflective material (e.g., metal or some other suitable reflective material). By reflecting the radiation 118, the inter-pixel trench isolation structure 116 prevents the radiation 118 from passing between the pixel sensors 104 and hence reduces crosstalk. Further, the inter-pixel trench isolation structure 116 reflects the radiation 118 back to the photodetectors 108 and hence increases absorption of the radiation 118.

In some embodiments, color filters 120 and/or microlenses 122 are stacked over the pixel sensors 104 and the backside dielectric layer 110. For ease of illustration, only some of the color filters 120 are labeled 120, and only some of the microlenses 122 are labeled 122. The color filters 120 transmit assigned wavelengths of the radiation 118 while blocking unassigned wavelengths of the radiation 118. For example, one of the color filters 120 may transmit red wavelengths of radiation while blocking blue wavelengths of radiation, whereas another one of the color filters 120 may transmit blue wavelengths of radiation while blocking red wavelengths of radiation. The microlenses 122 focus the radiation 118 on the photodetectors 108 and hence enhance absorption of the radiation 118.

Figure 1B:
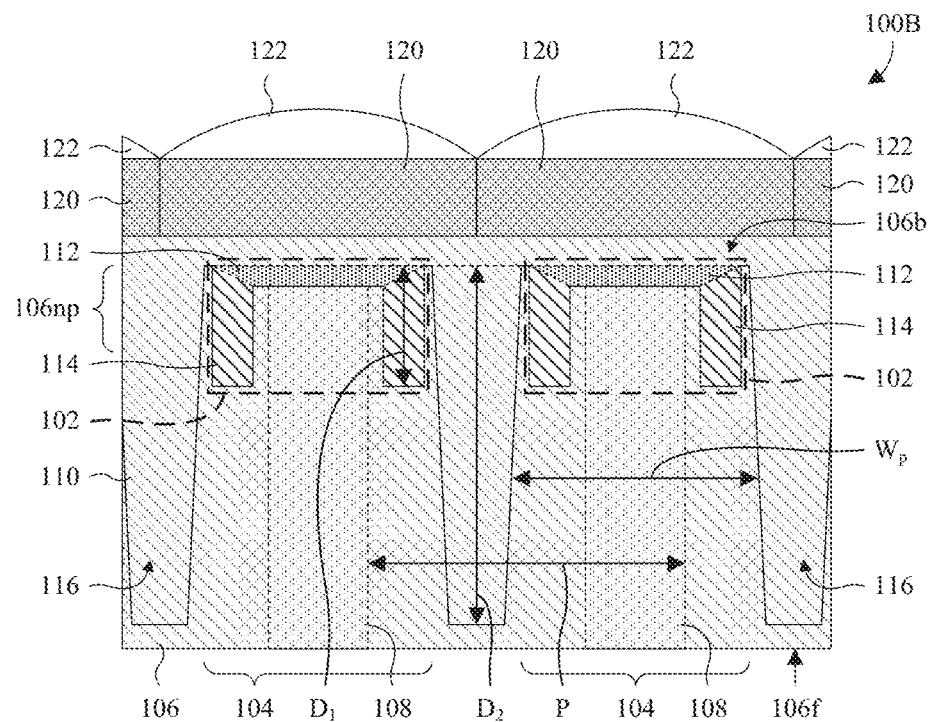

With reference to FIG. 1B, a cross-sectional view 100B of some alternative embodiments of the image sensor of FIG. 1A is provided in which in which bottom profiles of the absorption enhancement structures 112 are flat. Other profiles are, however, amenable.

Figure 2A:
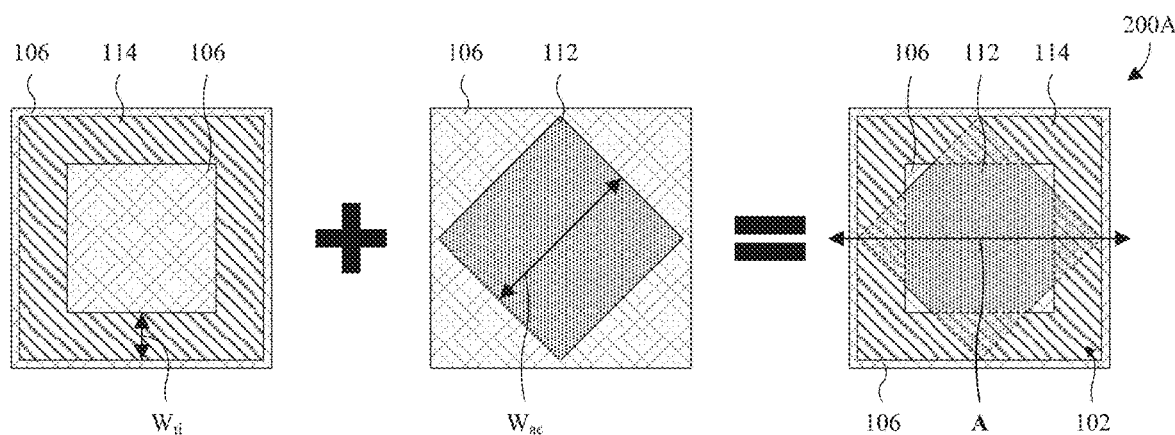
FIGS. 2A-2D illustrate top layouts of various embodiments of a CBSI structure in FIGS. 1A and 1B.

With reference to FIG. 2A, a top layout 200A of some embodiments of any one of the CBSI structures 102 in FIGS. 1A and 1B is provided. The cross-sectional view of the CBSI structure in FIGS. 1A and 1B may, for example, be taken along line A. For clarity, the top layout 200A illustrates the absorption enhancement structure 112 and the intra-pixel trench isolation structure 114 separately and further illustrates a combination of the absorption enhancement structure 112 and the intra-pixel trench isolation structure 114. As should be appreciated, it's the combination that corresponds to the CBSI structure 102 in FIGS. 1A and 1B.

The intra-pixel trench isolation structure 114 has a square ring-shaped layout and the absorption enhancement structure 112 has a diamond shaped layout. Other layouts are, however, amenable. In some embodiments, a width $W_{ti}$ of the intra-pixel trench isolation structure 114 is about 0.05-1.00 micrometers, about 0.05-0.50 micrometers, about 0.5-1.0 micrometers, about 0.17 micrometers, or about 0.12 micrometers. In some embodiments, a width $W_{ae}$ of the absorption enhancement structure 112 is about 0.05-1.0 micrometers, about 0.05-0.50 micrometers, about 0.5-1.0 micrometers. Other suitable values are, however, amenable for the widths $W_{ti}$, $W_{ae}$.

Figure 2B:
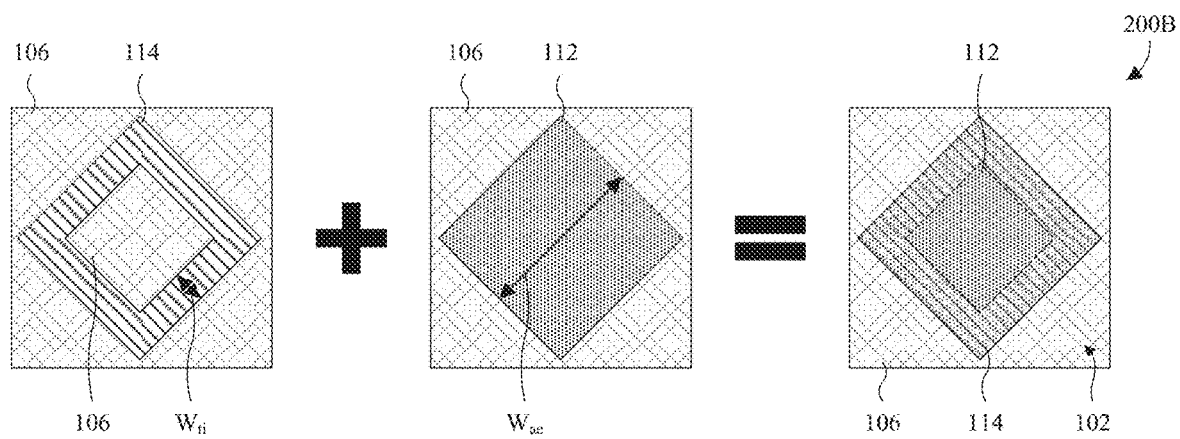
Figure 2C:
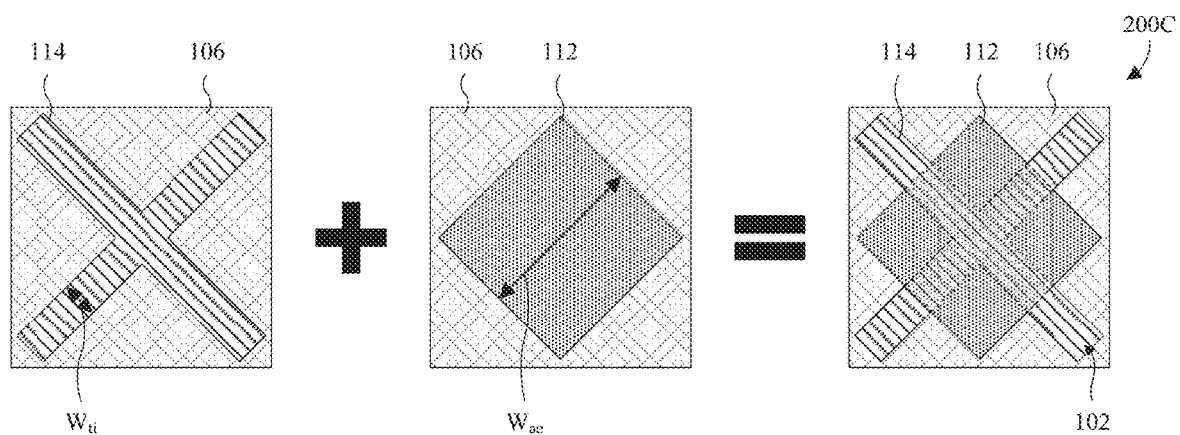
Figure 2D:
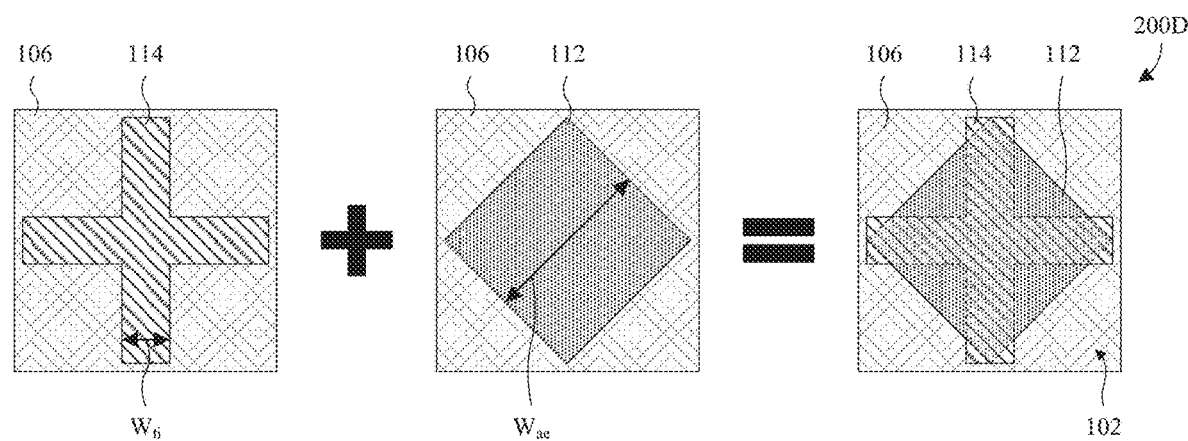

With reference to FIGS. 2B-2D, top layouts 200B-200D of various alternative embodiments of the CBSI structure 102 of FIG. 2A is provided. The intra-pixel trench isolation structure 114 has a diamond ring-shaped layout in FIG. 2B, and the intra-pixel trench isolation structure 114 has different cross shaped layouts in FIGS. 2C and 2D. Additional layouts are, however, amenable.

Figure 3A:
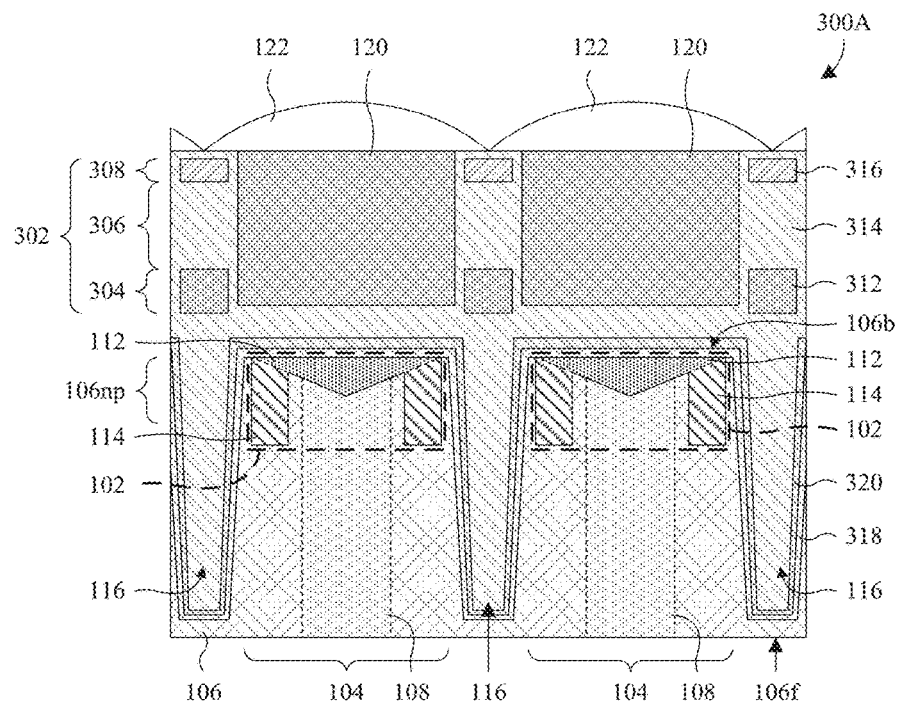
FIGS. 3A and 3B illustrate cross-sectional views of some alternative embodiments of the image sensors of FIGS. 1A and 1B in which the image sensors comprise composite grids.

With reference to FIG. 3A, a cross-sectional view 300A of some alternative embodiments of the image sensor of FIG. 1A is provided in which the image sensor comprises a composite grid 302 on the backside 106b of the semiconductor substrate 106. The composite grid 302 accommodates the color filters 120, and the microlenses 122 overlie the color filters 120 and the composite grid 302. The composite grid 302 comprises a metal grid 304, a dielectric grid 306, and a hard mask grid 308. In alternative embodiments, the hard mask grid 308 is omitted. The dielectric grid 306 overlies the metal grid 304, and the hard mask grid 308 overlies the dielectric grid 306.

A metal layer 312, a backside dielectric layer 314, and a hard mask layer 316 respectively define the metal grid 304, the dielectric grid 306, and the hard mask grid 308. The metal layer 312 may, for example, be or comprise tungsten, aluminum copper, titanium nitride, some other suitable metal(s), or any combination of the foregoing. In some embodiments, the metal layer 312 comprises a titanium nitride layer, and further comprises a tungsten layer overlying the titanium nitride layer. In alternative embodiments, the metal layer 312 comprises a top titanium nitride layer and a bottom titanium nitride layer, and further comprises an aluminum copper layer between the top and bottom titanium nitride layers. In alternative embodiments, the metal layer 312 comprises the top titanium nitride layer and the aluminum copper layer, but not the bottom titanium nitride layer. The backside dielectric layer 314 may be or comprise, for example, silicon oxide and/or some other suitable dielectric(s). The hard mask layer 316 may be or comprise, for example, silicon nitride and/or some other suitable dielectric(s).

A first backside liner 318 and a second backside liner 320 line an underside of the backside dielectric layer 314 and are arranged so the second backside liner 320 is between the first backside liner 318 and the backside dielectric layer 314. Further, the first and second backside liners 318, 320 separate the backside dielectric layer 314 from the CBSI structures 102 and define the inter-pixel trench isolation structure 116 with the backside dielectric layer 314. The first backside liner 318 and/or the CBSI structures 102 may be or comprise, for example, silicon oxide and/or some other suitable dielectric(s). In some embodiments, the first backside liner 318 and/or the CBSI structures 102 are or comprise the same material and/or are portions of the same deposition. The second backside liner 320 may be or comprise, for example, hafnium oxide, tantalum oxide, some other suitable high k dielectric(s), or any combination of the foregoing.

Figure 3B:
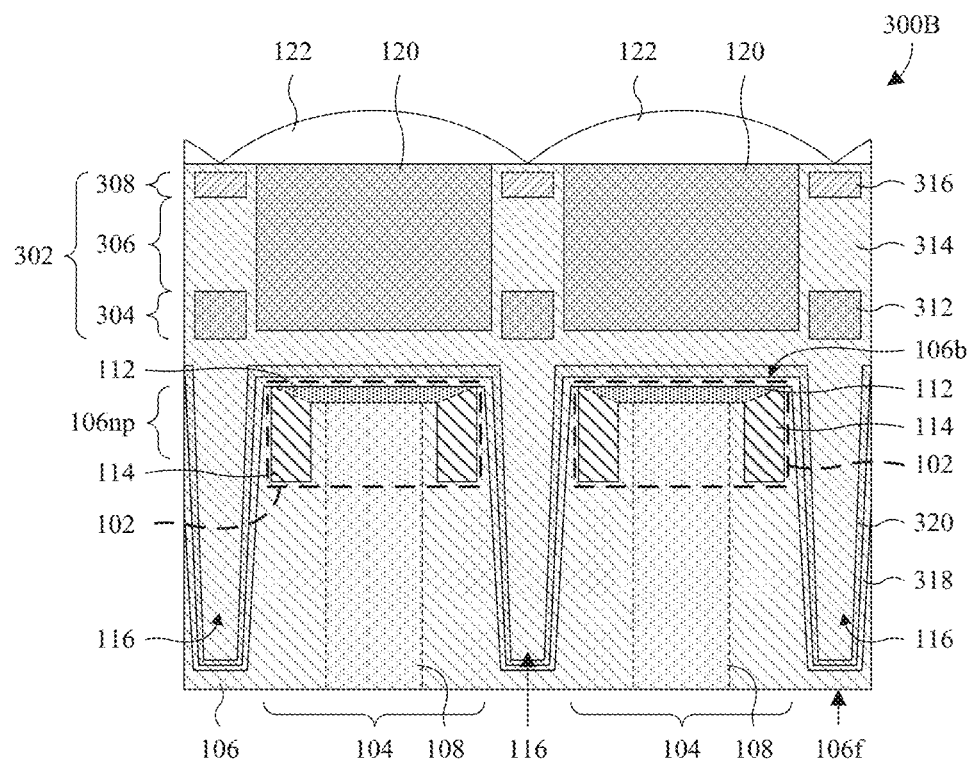

With reference to FIG. 3B, a cross-sectional view 300B of some alternative embodiments of the image sensor of FIG. 3A is provided in which in which bottom profiles of the absorption enhancement structures 112 are flat. Other profiles are, however, amenable.

Figure 4A:
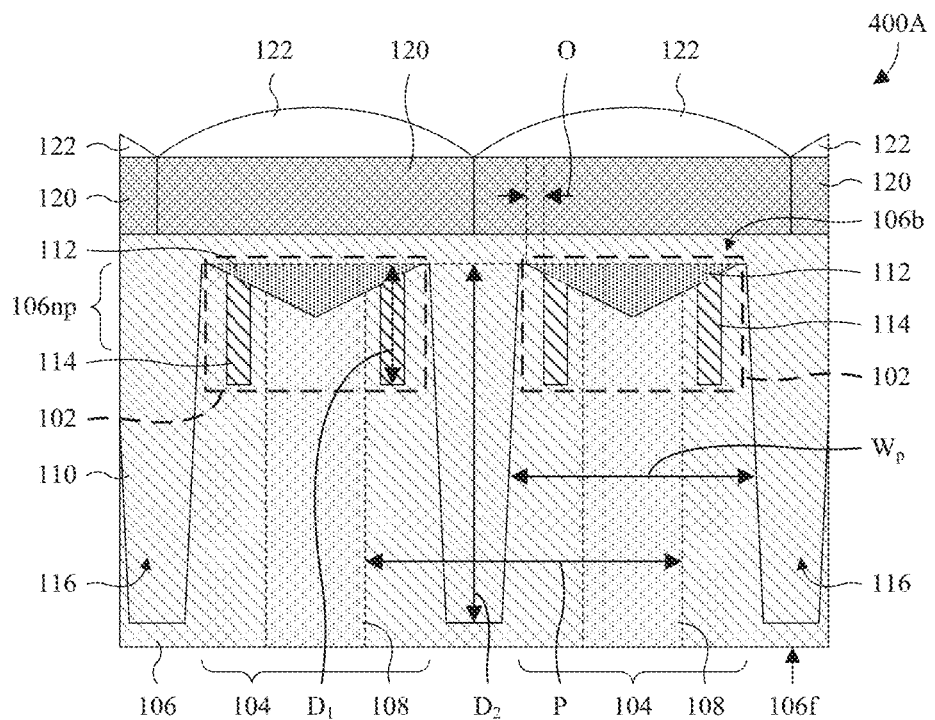
FIGS. 4A and 4B illustrate cross-sectional views of some alternative embodiments of the image sensors of FIGS. 1A and 1B in which intra-pixel trench isolation structures adjoin, and are offset from outer edges of, absorption enhancement structures.
Figure 4B:
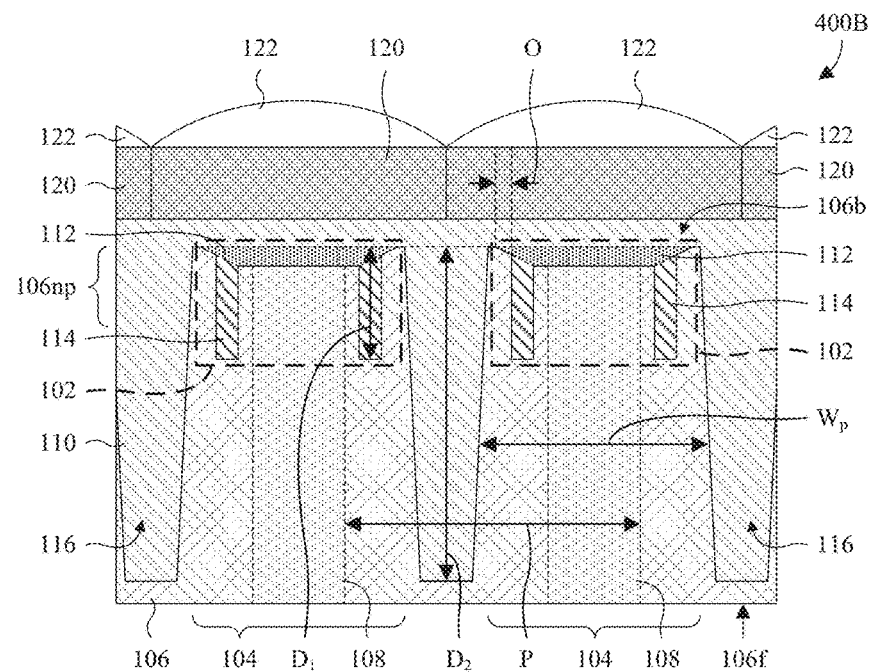

With reference to FIGS. 4A and 4B, cross-sectional views 400A, 400B of some alternative embodiments of the image sensors of FIGS. 1A and 1B are provided in which the intra-pixel trench isolation structures 114 adjoin the absorption enhancement structures 112 and are offset from outer edges of the absorption enhancement structures 112 by an offset O. Supposing the pixel sensors 104 have a width $W_p$ of about one micrometer, simulations indicate that the CBSI structures 102 may, for example, enhance quantum efficiency by about 6.3% and about 2.8% respectively for 850 nanometer radiation and 940 nanometer radiation compared to an image sensor without the intra-pixel trench isolation structures 114.

Figure 5:
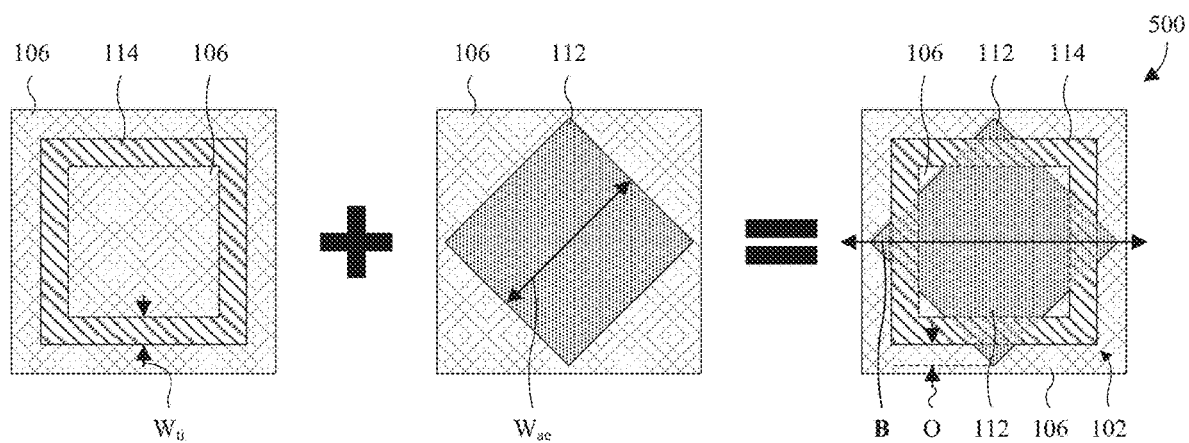
FIG. 5 illustrates a top layout of some embodiments of a CBSI structure in FIGS. 4A and 4B.

With reference to FIG. 5, a top layout 500 of some embodiments of any one of the CBSI structures 102 in FIGS. 4A and 4B is provided. The cross-sectional view of the CBSI structure in FIGS. 4A and 4B may, for example, be taken along line B. The top layout 500 is as the top layout 200A of FIG. 2A is described, except for the offset O. Hence, the intra-pixel trench isolation structure 114 has a square ring-shaped layout and the absorption enhancement structure 112 has a diamond shaped layout. Other layouts are, however, amenable. For example, the intra-pixel trench isolation structure 114 may have a layout in any one of FIGS. 2B-2D.

Figure 6A:
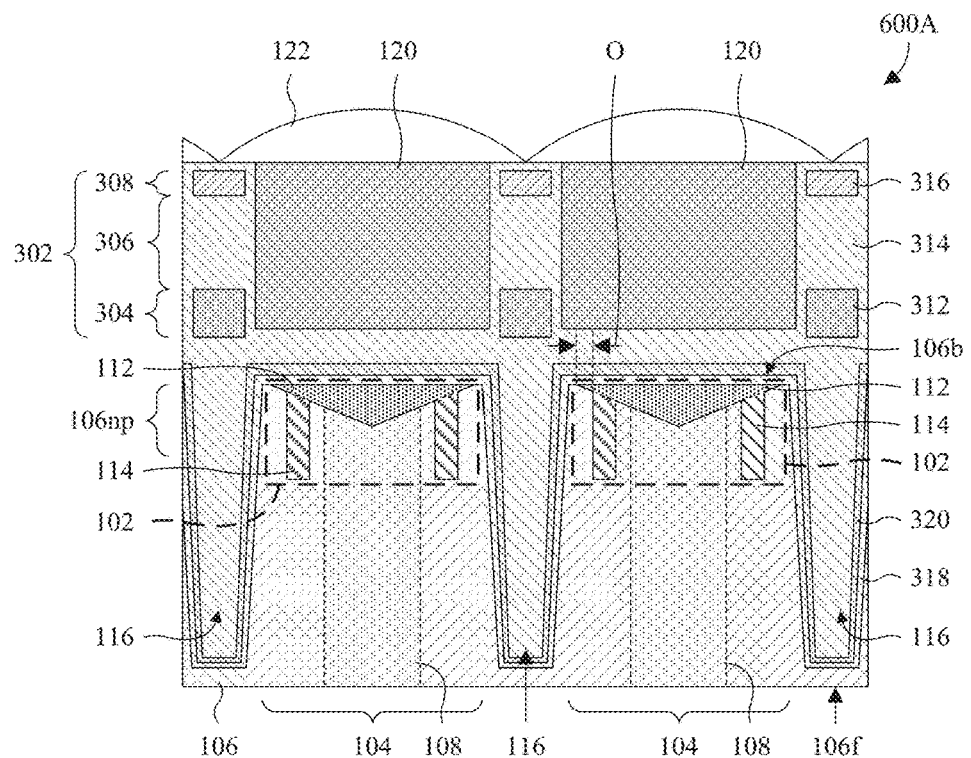
FIGS. 6A and 6B illustrate cross-sectional views of some alternative embodiments of the image sensors of FIGS. 4A and 4B in which the image sensors comprise composite grids.
Figure 6B:
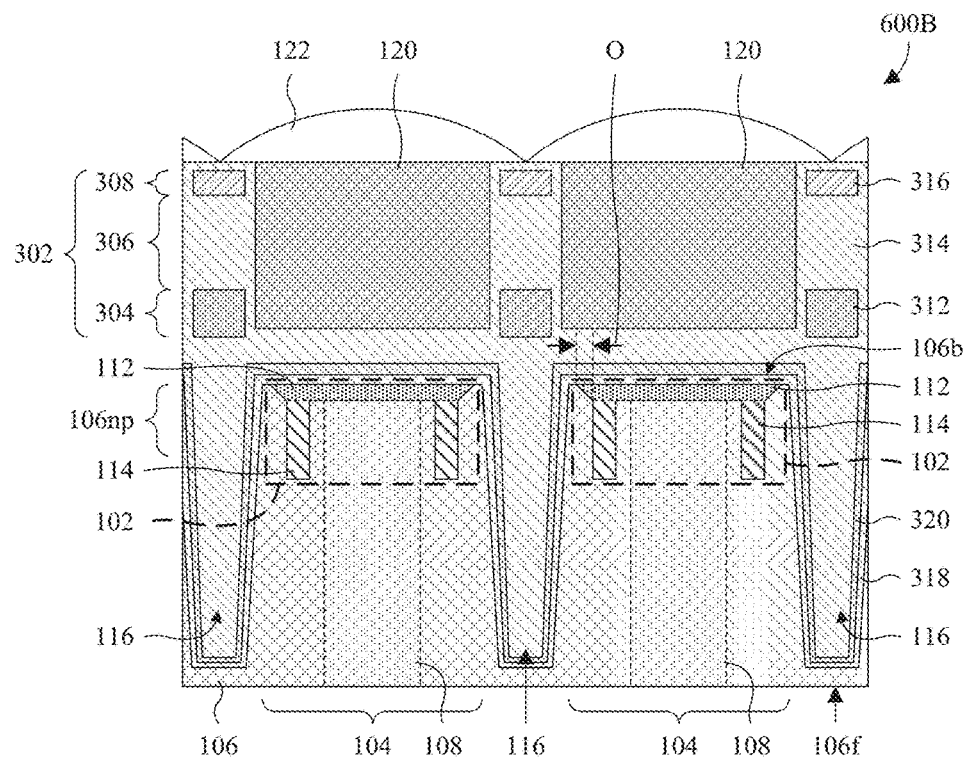

With reference to FIGS. 6A and 6B, cross-sectional views 600A, 600B of some alternative embodiments of the image sensors of FIGS. 4A and 4B are provided in which the image sensors comprise composite grids 302 on the backsides 106b of the semiconductor substrates 106. The cross-sectional views 600A, 600B are as the cross-sectional views 300A, 300B of FIGS. 3A and 3B are described, except for the offset O.

Figure 7:
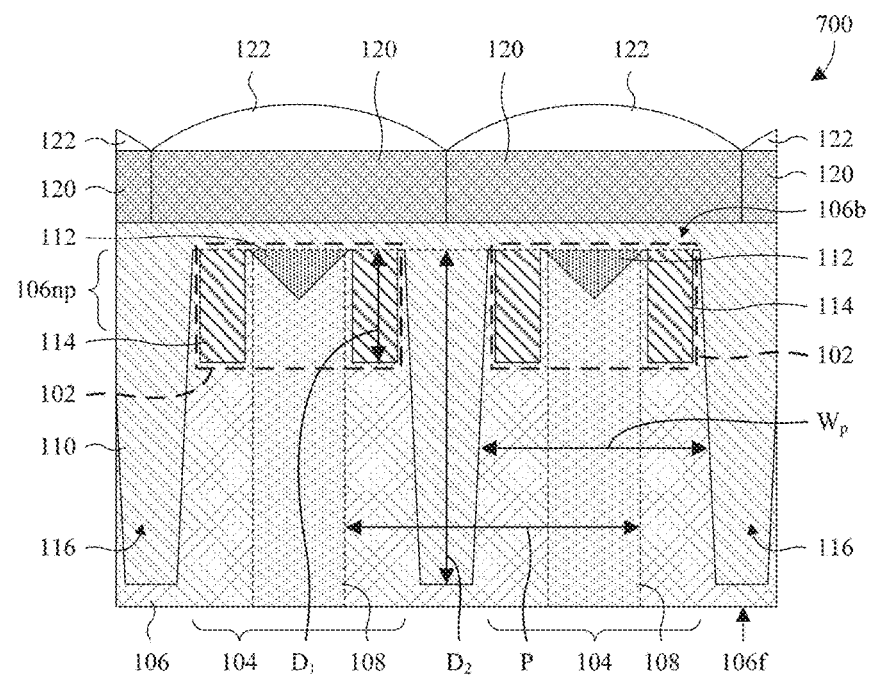
FIG. 7 illustrates a cross-sectional view of some alternative embodiments of the image sensor of FIG. 1A in which intra-pixel trench isolation structures are spaced from absorption enhancement structures.

With reference to FIG. 7, a cross-sectional view 700 of some alternative embodiments of the image sensor of FIG. 1A is provided in which the intra-pixel trench isolation structures 114 are spaced from the absorption enhancement structures 112. Supposing the pixel sensors 104 have a width $W_p$ of about one micrometer, simulations indicate that the CBSI structures 102 may, for example, enhance quantum efficiency by about 6.3% and about 2.8% respectively for 850 nanometer radiation and 940 nanometer radiation compared to an image sensor without the intra-pixel trench isolation structures 114. As noted above with regard to FIG. 1A, the intra-pixel trench isolation structures 114 comprise individual pairs of intra-pixel trench isolation segments (not individually labeled). In alternative embodiments of the image sensor of FIG. 7, edges of the intra-pixel trench isolation structures 114 adjoin edges of the absorption enhancement structures 112 while the absorption enhancement structures 112 remain completely between the intra-pixel trench isolation segments of corresponding pairs.

Figure 8:
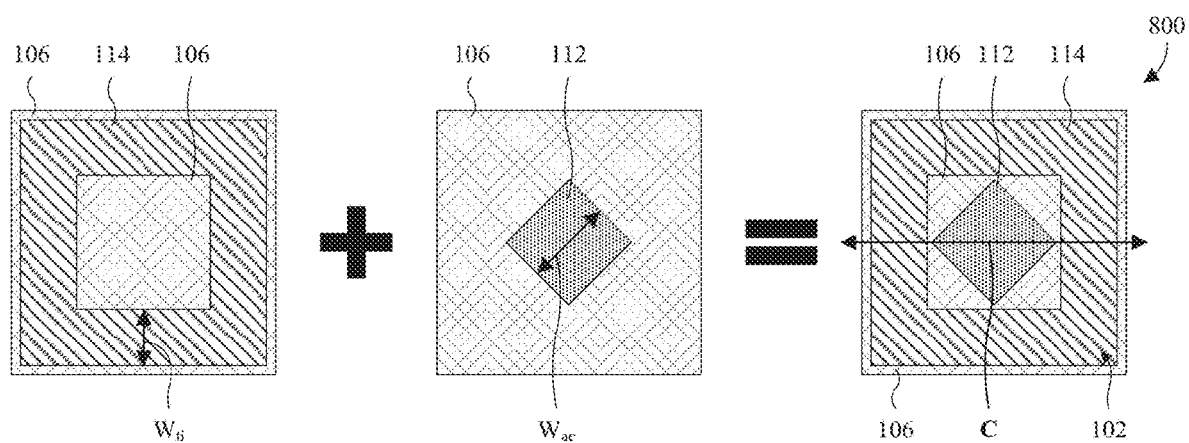
FIG. 8 illustrates a top layout of some embodiments of a CBSI structure in FIG. 7.

With reference to FIG. 8, a top layout 800 of some embodiments of any one of the CBSI structures 102 in FIG. 7 is provided. The cross-sectional view of the CBSI structure in FIG. 7 may, for example, be taken along line C. The top layout 800 is as the top layout 200A of FIG. 2A is described, except that the absorption enhancement structure 112 is spaced from the intra-pixel trench isolation structure 114. Hence, the intra-pixel trench isolation structure 114 has a square ring-shaped layout and the absorption enhancement structure 112 has a diamond shaped layout. Other layouts are, however, amenable. For example, the intra-pixel trench isolation structure 114 may have a square ring shaped layout or some other suitable ring shaped layout that circumscribes the absorption enhancement structure 112.

Figure 9:
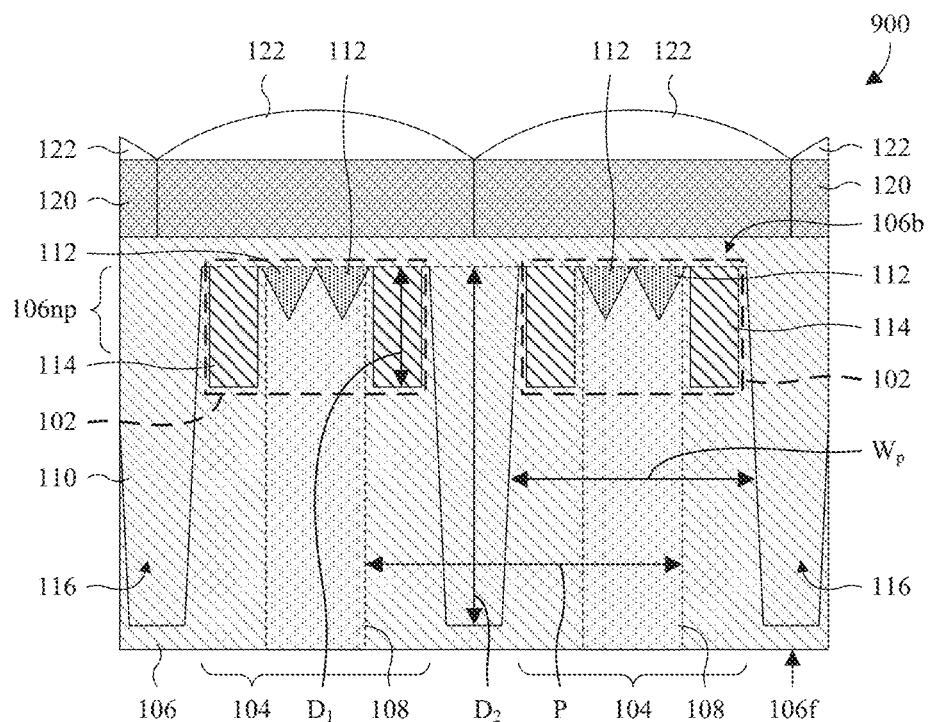
FIG. 9 illustrates a cross-sectional view of some alternative embodiments of the image sensor of FIG. 7 in which the absorption enhancement structures each comprise multiple protrusions.

With reference to FIG. 9, a cross-sectional view 900 of some alternative embodiments of the image sensor of FIG. 7 is provided in which the absorption enhancement structures 112 each have multiple protrusions. For example, as illustrated, the absorption enhancement structures 112 each have two protrusions with triangular profiles. More than two protrusions and/or other protrusion profiles are, however, amenable.

Figure 10:
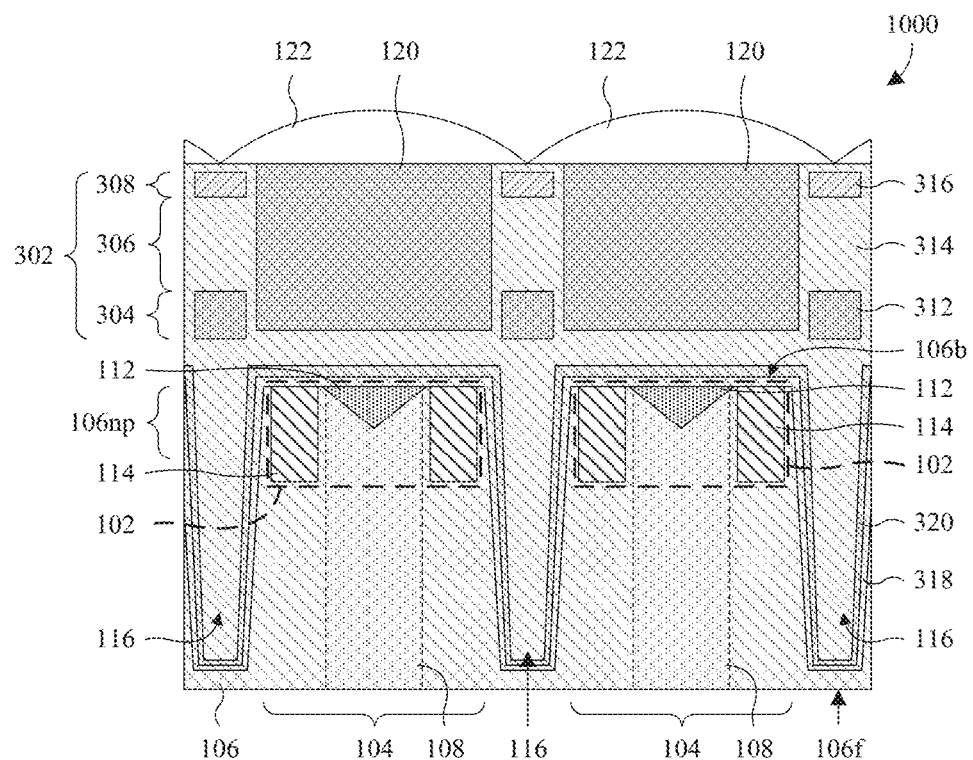
FIG. 10 illustrates a cross-sectional view of some alternative embodiments of the image sensor of FIG. 7 in which the image sensor comprises a composite grid.

With reference to FIG. 10, a cross-sectional view 1000 of some alternative embodiments of the image sensor of FIG. 7 is provided in which the image sensor comprises a composite grid 302 on the backside 106b of the semiconductor substrate 106. The cross-sectional view 900 is as the cross-sectional views 300A, 300B of FIGS. 3A and 3B are described, except that the intra-pixel trench isolation structures 114 are spaced from the absorption enhancement structures 112. In alternative embodiments, the absorption enhancement structures 112 each have multiple protrusions, an example of which is shown in FIG. 9.

Figure 11A:
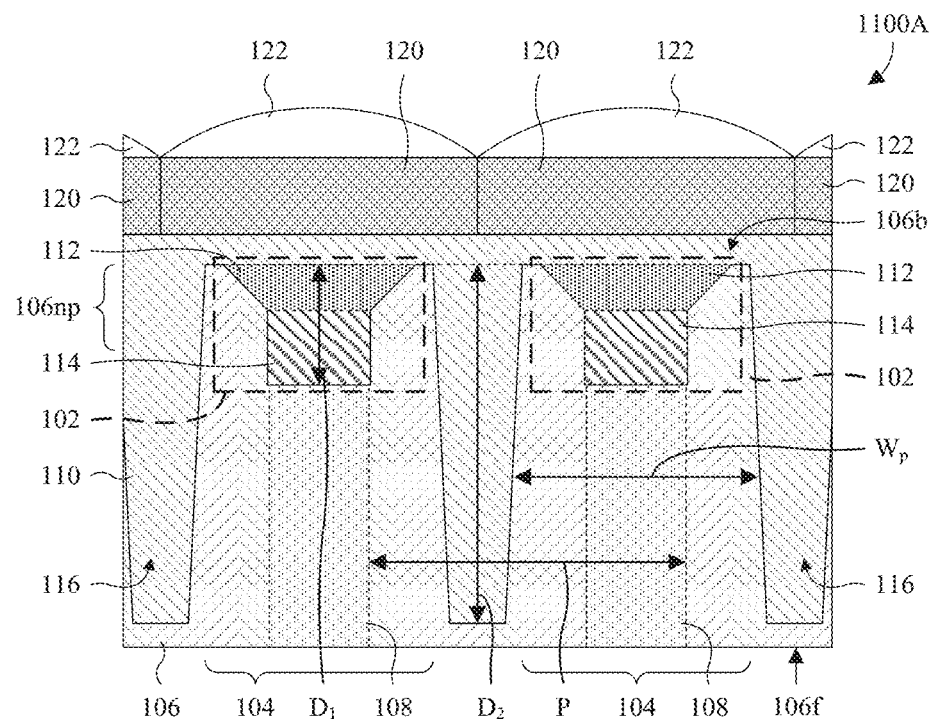
FIGS. 11A and 11B illustrate cross-sectional views of various alternative embodiments of the image sensor of FIG. 1A in which intra-pixel trench isolation structures have columnar profiles and are localized to centers of absorption enhancement structures.

With reference to FIG. 11A, a cross-sectional view 1100A of some alternative embodiments of the image sensor of FIG. 1A is provided in which the intra-pixel trench isolation structures 114 have columnar profiles and are localized to centers of the absorption enhancement structures 112. Other profiles are, however, amenable. Supposing the pixel sensors 104 have a width $W_p$ of about one micrometer, simulations indicate that the CBSI structures 102 may, for example, enhance quantum efficiency by about 2.2% and about 0.8% respectively for 850 nanometer radiation and 940 nanometer radiation compared to an image sensor without the intra-pixel trench isolation structures 114.

Figure 11B:
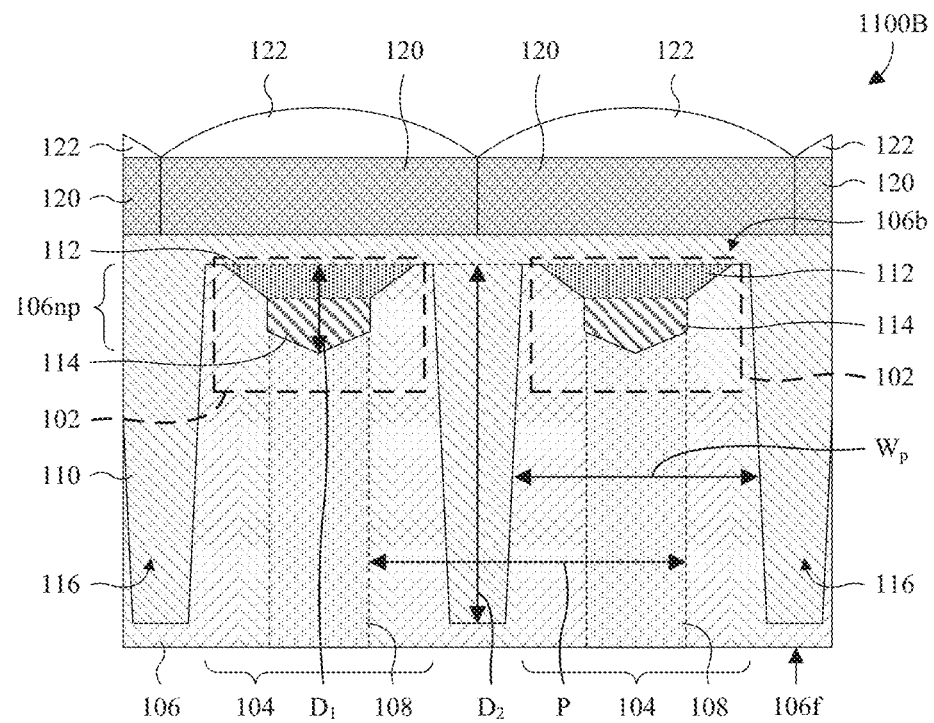

With reference to FIG. 11B, a cross-sectional view 1100B of some alternative embodiments of the image sensor of FIG. 11A is provided in which a bottom profile of the intra-pixel trench isolation structures 114 is triangular. Other profiles are, however, amenable. Slanted sidewalls at the bottom of the intra-pixel trench isolation structures 114 may, for example, enhance TIR in embodiments in which the intra-pixel trench isolation structures 114 are or comprise a material with a smaller refractive index than that of the semiconductor substrate 106. As a result, radiation that has passed through the semiconductor substrate 106 unabsorbed and has been reflected back towards the backside 106b of the semiconductor substrate 106 from an underlying interconnect structure (not shown) is more likely to be reflected back to the photodetectors 108 by the intra-pixel trench isolation structures 114. This, in turn, enhances quantum efficiency of the photodetectors 108.

Figure 12:
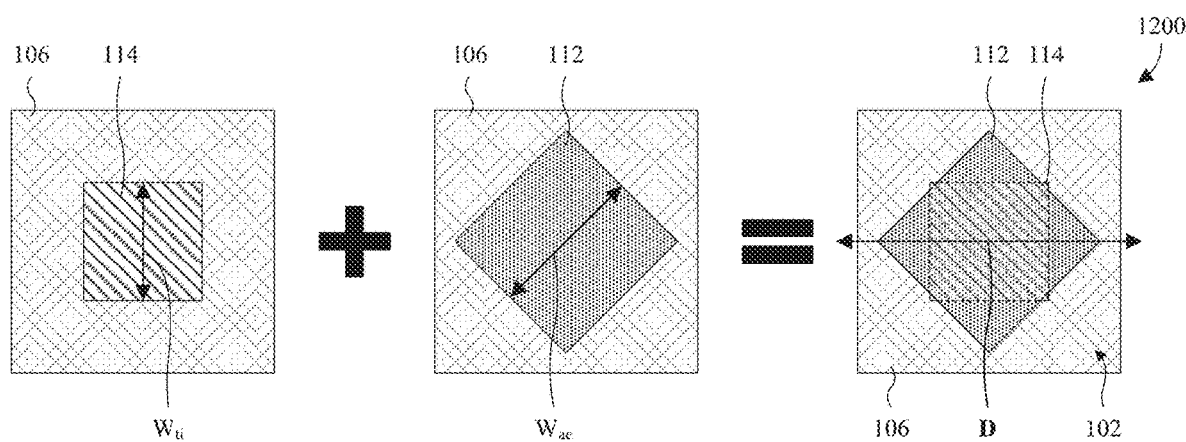
FIG. 12 illustrates a top layout of some embodiments of a CBSI structure in FIGS. 11A and 11B.

With reference to FIG. 12, a top layout 1200 of some embodiments of any one of the CBSI structures 102 in FIGS. 11A and 11B is provided. The cross-sectional view of the CBSI structure in FIGS. 11A and 11B may, for example, be taken along line D. The top layout 1200 is as the top layout 200A of FIG. 2A is described, except that the intra-pixel trench isolation structure 114 has a square shaped layout and is localized to a center of the absorption enhancement structure 112. Other layouts are, however, amenable. In some embodiments, increasing the width $W_{ti}$ of the intra-pixel trench isolation structure 114 increases quantum efficiency at 850 nanometer radiation and/or 940 nanometer radiation.

Figure 13:
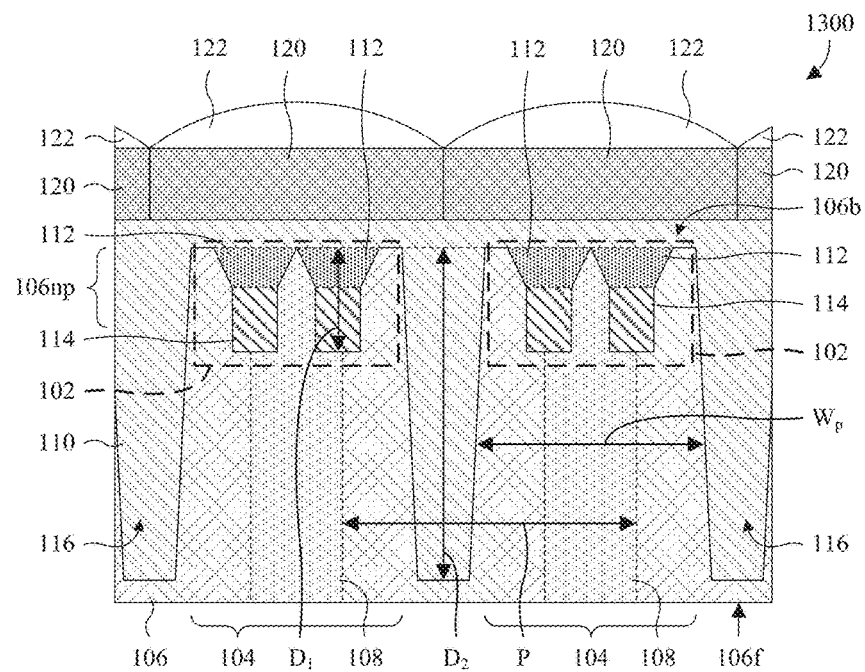
FIG. 13 illustrates a cross-sectional view of some alternative embodiments of the image sensor of FIG. 11A in which the CBSI structures each comprise multiple absorption enhancement structures and multiple intra-pixel trench isolation structures.

With reference to FIG. 13, a cross-sectional view 1300 of some alternative embodiments of the image sensor of FIG. 11A is provided in which the CBSI structures 102 each comprise multiple absorption enhancement structures 112 and multiple intra-pixel trench isolation structures 114. For example, as illustrated, the CBSI structures 102 each comprise two absorption enhancement structures 112 and two intra-pixel trench isolation structures 114. More than two absorption enhancement structures 112 and/or more than two intra-pixel trench isolation structures 114 are, however, amenable. The absorption enhancement structures 112 and the intra-pixel trench isolation structures 114 are paired, such that each pair has an absorption enhancement structure and an intra-pixel trench isolation structure. Further, each pair is as a CBSI structure 102 of FIG. 11A and/or FIG. 12 is illustrated and described.

While FIG. 13 is illustrated using embodiments of the intra-pixel trench isolation structures 114 in FIG. 11A, embodiments of the intra-pixel trench isolation structures 114 in FIG. 11B are also amenable. As such, it should be appreciated that bottom profiles of the intra-pixel trench isolation structures 114 may alternatively be triangular as illustrated in FIG. 11B. Other bottom profiles are also amenable.

Figure 14A:
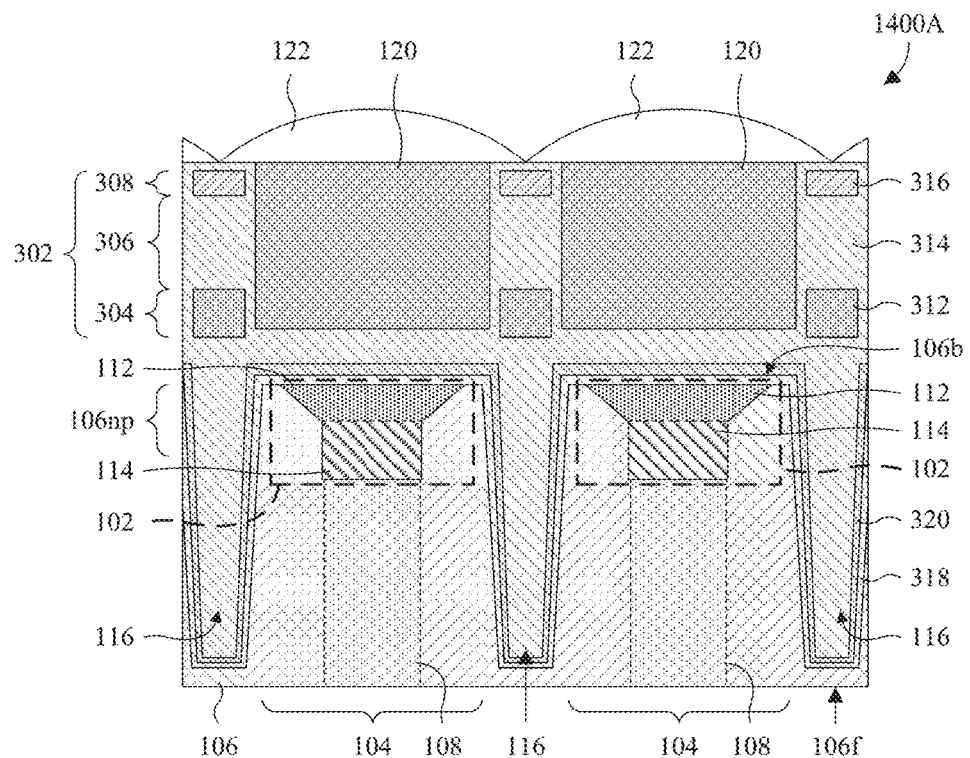
FIGS. 14A and 14B illustrate cross-sectional views of some alternative embodiments of the image sensors of FIGS. 11A and 11B in which the image sensors comprise composite grids.
Figure 14B:
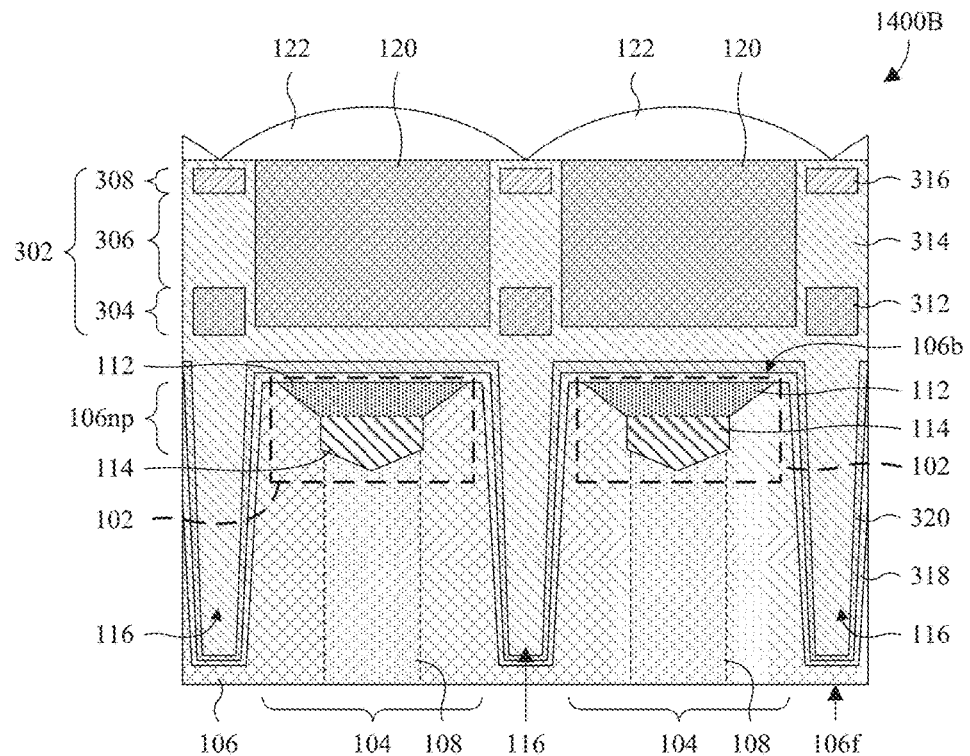

With reference to FIGS. 14A and 14B, cross-sectional views 1400A, 1400B of some alternative embodiments of the image sensors of FIGS. 11A and 11B are provided in which the image sensors comprise composite grids 302 on the backsides 106b of the semiconductor substrates 106. The cross-sectional views 14A and 14B are as the cross-sectional views 300A, 300B of FIGS. 3A and 3B are described, except that the intra-pixel trench isolation structures 114 have columnar profiles and are localized to centers of the absorption enhancement structures 112. Additionally, while FIGS. 14A and 14B illustrate the CBSI structures 102 as each having a single intra-pixel trench isolation structure 114 and a single absorption enhancement structure 112, the CBSI structures 102 may each have two or more intra-pixel trench isolation structures 114 and two or more absorption enhancement structures 112 in alternative embodiments. An example of such a configuration is illustrated and described with regard to FIG. 13.

Figure 15:
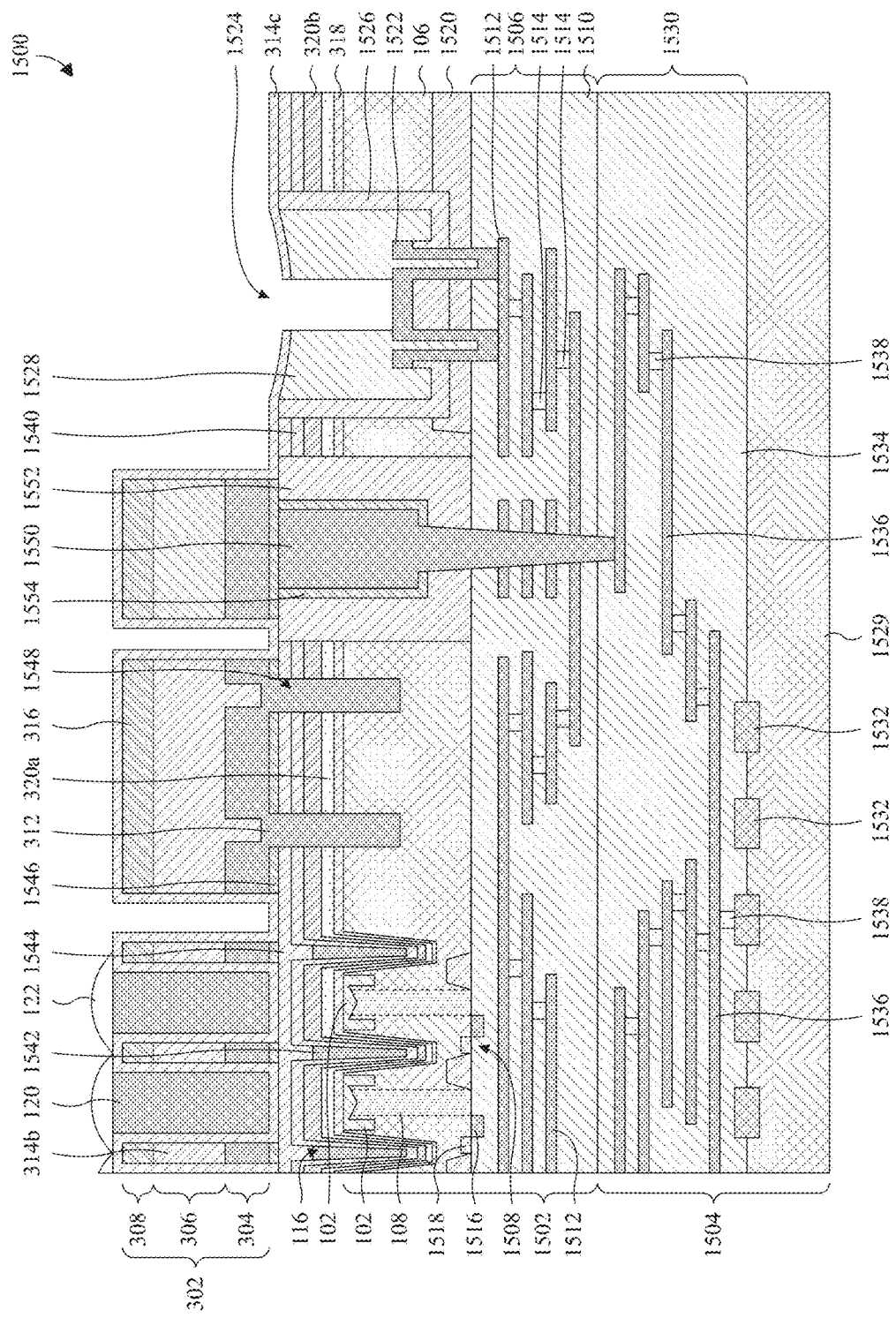
FIG. 15 illustrates a cross-sectional view of some embodiments of a 3D BSI image sensor comprising CBSI structures to enhance performance.

With reference to FIG. 15, a cross-sectional view 1500 of some embodiments of a three-dimension (3D) BSI image sensor comprising CBSI structures 102 is provided. The 3D BSI image sensor comprises a first integrated chip 1502 and a second integrated chip 1504 that are bonded together. The first integrated chip 1502 comprise a first substrate 106, a first interconnect structure 1506, and a plurality of transfer transistors 1508. For ease of illustration, only one of the transfer transistors 1508 is labeled 1508.

The first interconnect structure 1506 and the transfer transistors 1508 are on a frontside of the first substrate 106, and the transfer transistors 1508 are between the first interconnect structure 1506 and the first substrate 106. The first interconnect structure 1506 comprises a first interconnect dielectric layer 1510, and further comprises a plurality of first wires 1512 and a plurality of first vias 1514. For ease of illustration, only some of the first wires 1512 are labeled 1512 and only some of the first vias 1514 are labeled 1514. The first wires 1512 and the first vias 1514 are conductive and are alternatingly stacked in the first interconnect dielectric layer 1510 to define conductive paths. The transfer transistors 1508 comprise individual transfer gate stacks 1516 and individual source/drain regions. First source/drain regions of the transfer transistors 1508 are defined by photodetectors 108 in the first substrate 106, and second source/drain regions of the transfer transistors 1508 are defined by floating diffusion (FD) regions 1518 in the first substrate 106. For ease of illustration, only one of the transfer gate stacks 1516 is labeled 1516, only one of the photodetectors 108 is labeled 108, and only one of the FD regions 1518 is labeled 1518.

In some embodiments, a frontside isolation structure 1520 extends into the first substrate 106. For ease of illustration, only one segment of the frontside isolation structure 1520 is labeled 1520. In some embodiments, the frontside isolation structure 1520 separates the transfer transistors 1508 and/or adjoins a pad structure 1522. The pad structure 1522 is exposed by a pad opening 1524 and is surrounded by a pad dielectric liner 1526 and a pad dielectric layer 1528. The frontside isolation structure 1520 may be or comprise, for example, a shallow trench isolation (STI) structure or some other suitable isolation structure.

The second integrated chip 1504 comprise a second substrate 1529, a second interconnect structure 1530, and a plurality of logic transistors 1532. For ease of illustration, only some of the logic transistors 1532 are labeled 1532. The second integrated chip 1504 is bonded to the first integrated chip 1502, such that the first and second interconnect structures 1506, 1530 are between the first and second substrate 106, 1529. The second integrated chip 1504 may, for example, comprise image signal processing (ISP) circuitry, read and/or write circuitry, or some other suitable circuitry for readout of the photodetectors 108.

The second interconnect structure 1530 and the logic transistors 1532 are on a frontside of the second substrate 1529, and the logic transistors 1532 are between the second interconnect structure 1530 and the second substrate 1529. The second interconnect structure 1530 comprises a second interconnect dielectric layer 1534, and further comprises a plurality of second wires 1536 and a plurality of second vias 1538. For ease of illustration, only some of the second wires 1536 are labeled 1536 and only some of the second vias 1538 are labeled 1538. The second wires 1536 and the second vias 1538 are conductive and are alternatingly stacked in the second interconnect dielectric layer 1534 to define conductive paths.

CBSI structures 102 and an inter-pixel trench isolation structure 116 extend into a backside of the first substrate 106. The CBSI structures 102 overlie the photodetectors 108, and the inter-pixel trench isolation structure 116 separates the photodetectors 108. For ease of illustration, only one of three illustrated segments of the inter-pixel trench isolation structure 116 are labeled 116. The CBSI structures 102 and the inter-pixel trench isolation structure 116 may, for example, be as illustrated and described with regard to any one of the preceding figures. (e.g., FIG. 1A or 6B). The inter-pixel trench isolation structure 116 is defined by a first backside liner 318, a pair of second backside liners 320a, 320b, a third backside liner 1540, and a first metal grid 1542. In some embodiments, the CBSI structures 102 are defined by the first backside liner 318, the pair of second backside liners 320a, 320b, the third backside liner 1540, or any combination of the foregoing. In alternative embodiments, the CBSI structures 102 are independent of these liners 318, 320a, 320b, 1540. The first and third backside liners 318, 1540 may be or comprise, for example, silicon oxide and/or some other suitable dielectric(s), and/or the second backside liners 320a, 320b may be or comprise, for example, high k dielectric(s) and/or some other suitable dielectric(s).

A cap layer 1544 covers the first metal grid 1542, and an etch stop layer 1546, a metal layer 312, a backside dielectric layer 314b, and a hard mask layer 316 are stacked over the cap layer 1544. The cap layer 1544 may, for example, be or comprise silicon oxide and/or some other suitable dielectric(s), and/or the etch stop layer 1546 may, for example, be or comprise silicon nitride and/or some other suitable dielectric(s). The metal layer 312, the backside dielectric layer 314b, and the hard mask layer 316 define a second metal grid 304, a dielectric grid 306, and a hard mask grid 308 (collectively a composite grid 302). Further, the metal layer 312 defines protrusions 1548 extending into the first substrate 106. For ease of illustration, only one of two illustrated protrusions 1548 is labeled 1548.

A composite grid liner 314c lines the composite grid 302, and color filters 120 are recessed into the composite grid 302 over the composite grid liner 314c. Further microlenses 122 overlie the color filters 120. A through substrate via (TSV) 1550 protrudes through the first substrate 106 and the first interconnect structure 1506 to the second interconnect structure 1530 and is surrounded by a pair of TSV liners 1552, 1554 at the first substrate 106. A first TSV liner 1552 of the pair may, for example, be or comprise silicon oxide and/or some other suitable dielectric(s), whereas a second TSV liner 1554 of the pair may, for example, be or comprise silicon nitride and/or some other suitable dielectric(s).

While FIG. 15 is illustrated using embodiments of the CBSI structures 102 in FIG. 1A, it is to be appreciated that embodiments of the CBSI structures 102 in any one of the preceding figures are amenable in alternative embodiments. For example, the 3D BSI image sensor of FIG. 15 may alternatively have embodiments of the CBSI structures 102 in FIG. 1B or 7.

With reference to FIGS. 16-20, a series of cross-sectional views 1600-2000 of some embodiments of a method for forming an image sensor comprising CBSI structures is provided. The cross-sectional views 1600-2000 illustrate the method using the image sensor of FIG. 1A but may also be used to form the image sensor in any one of FIGS. 1B, 4A, 4B, 7, 9, 11A, 11B, and 13.

As illustrated by the cross-sectional view 1600 of FIG. 16, pixel sensors 104 are formed on a frontside 106f of a semiconductor substrate 106 and, in some embodiments, the semiconductor substrate 106 is subsequently thinned to reduce a thickness $T_{ss}$ of the semiconductor substrate 106. The pixel sensors 104 comprise individual photodetectors 108 in the semiconductor substrate 106 and, in some embodiments, further comprise individual transistors (not shown) on the frontside 106f of the semiconductor substrate 106. The transistors may, for example, be used for readout of the photodetectors 108 and/or may, for example, comprise transfer transistors, reset transistors, select transistors, source follower transistors, some other suitable transistors, or any combination of the foregoing. The thickness $T_{ss}$ may, for example, be about 3.0-4.0 micrometers, about 3.5-4.0 micrometers, or about 3.5-4.0 micrometers upon completion of the thinning. Other thicknesses are, however, amenable.

Figure 16:
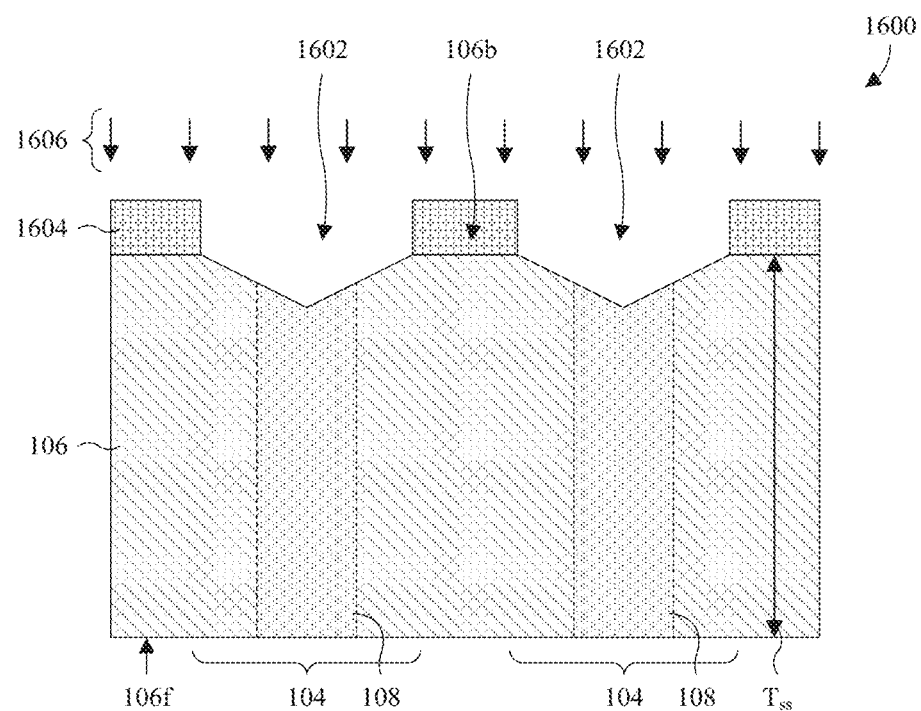
FIGS. 16-20 illustrate cross-sectional views of some embodiments of a method for forming an image sensor comprising CBSI structures.

Also illustrated by the cross-sectional view 1600 of FIG. 16, a backside 106b of the semiconductor substrate 106 is patterned to form absorption enhancement openings 1602. The absorption enhancement openings 1602 are individual to and respectively overlie the pixel sensors 104. The absorption enhancement openings 1602 are formed with a triangular profile, but other profiles are amenable. For example, the absorption enhancement openings 1602 may be formed with a profile matching the absorption enhancement structures 112 in any one of FIG. 1A, 1B, 7, 9, 11A, 11B, or 13 and/or with a top layout matching the absorption enhancement structure 112 in any one of FIGS. 2A-2D, 5, 8, and 12.

In some embodiments, the patterning is performed by an etching process or some other suitable patterning process. The etching process may, for example, comprise: 1) forming a mask 1604 on the backside 106b of the semiconductor substrate 106; 2) applying one or more etchants 1606 to the backside 106b with the mask 1604 in place; and 3) stripping the mask 1604. The mask 1604 may be or comprise, for example, photoresist, silicon nitride, some other suitable mask material, or any combination of the foregoing.

Figure 17:
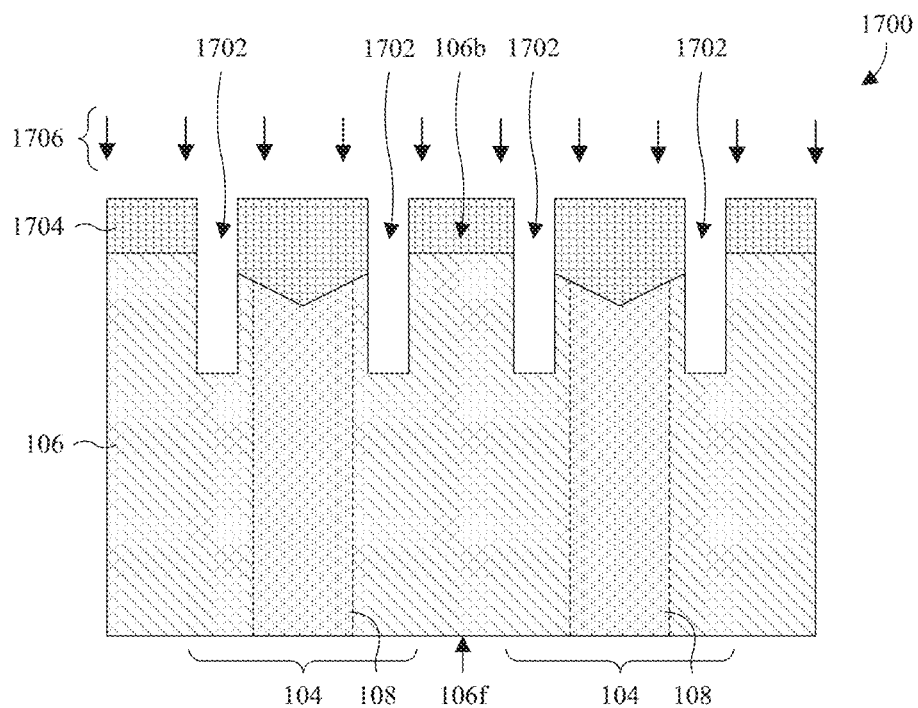

As illustrated by the cross-sectional view 1700 of FIG. 17, the backside 106b of the semiconductor substrate 106 is further patterned to form intra-pixel isolation trenches 1702. The intra-pixel isolation trenches 1702 are individual to the pixel sensors 104 and border and/or overlap the absorption enhancement openings 1602 (see FIG. 16). The intra-pixel isolation trenches 1702 may be formed with a profile matching the intra-pixel trench isolation structures 114 in any one of FIG. 1A, 1B, 7, 9, 11A, 11B, or 13 and/or with a top layout matching the intra-pixel trench isolation structure 114 in any one of FIGS. 2A-2D, 5, 8, and 12. In alternative embodiments, the intra-pixel isolation trenches 1702 are formed before the absorption enhancement openings 1602 (see FIG. 16) are formed.

In some embodiments, the patterning is performed by an etching process or some other suitable patterning process. The etching process may, for example, comprise: 1) forming a mask 1704 on the backside 106b of the semiconductor substrate 106; 2) applying one or more etchants 1706 to the backside 106b with the mask 1704 in place; and 3) stripping the mask 1704. The mask 1704 may be or comprise, for example, photoresist, silicon nitride, some other suitable mask material, or any combination of the foregoing.

Figure 18:
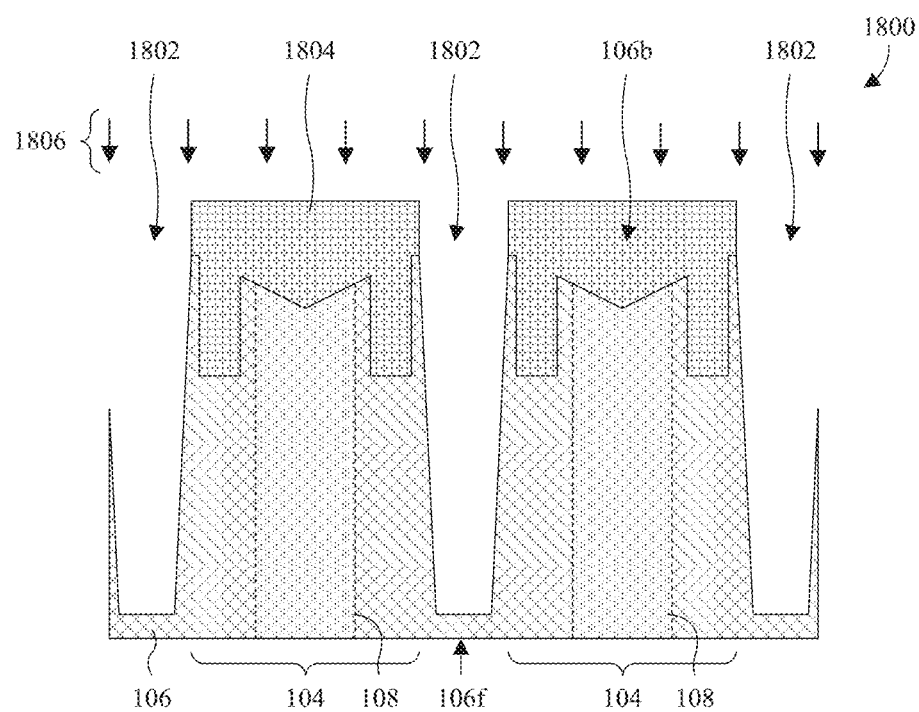

As illustrated by the cross-sectional view 1800 of FIG. 18, the backside 106b of the semiconductor substrate 106 is further patterned to form an inter-pixel isolation trench 1802. The inter-pixel isolation trench 1802 separates the pixel sensors 104 from each other and may, for example, have a grid-shaped top layout or some other suitable top layout.

In some embodiments, the patterning is performed by an etching process or some other suitable patterning process. The etching process may, for example, comprise: 1) forming a mask 1804 on the backside 106b of the semiconductor substrate 106; 2) applying one or more etchants 1806 to the backside 106b with the mask 1804 in place; and 3) stripping the mask 1804. The mask 1804 may be or comprise, for example, photoresist, silicon nitride, silicon oxide, some other suitable mask material, or any combination of the foregoing, and/or the stripping may, for example, be performed by a tetramethylammonium hydroxide (TMAH) etchant and/or some other suitable etchant(s).

Figure 19:
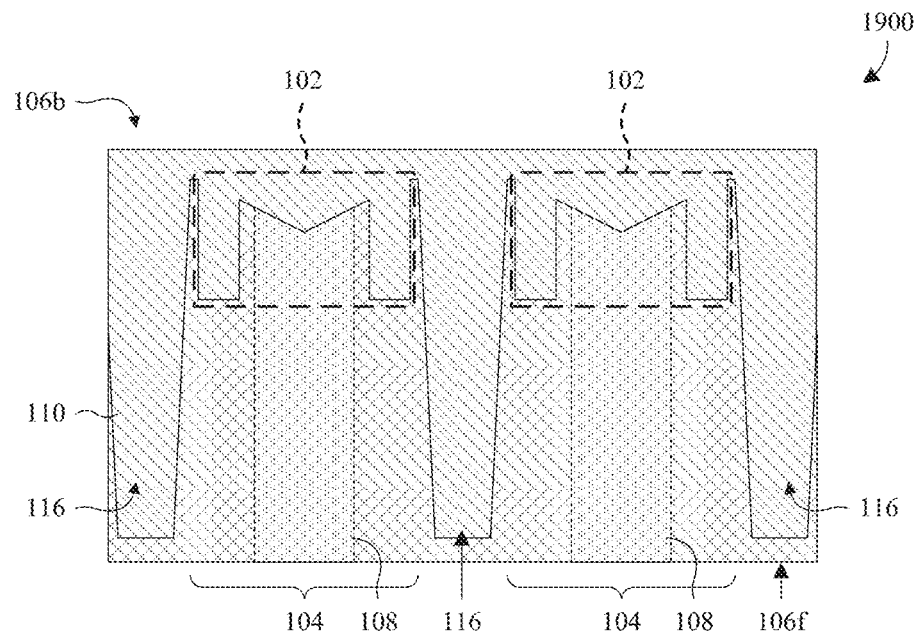

As illustrated by the cross-sectional view 1900 of FIG. 19, a backside dielectric layer 110 is formed covering the backside 106b of the semiconductor substrate 106, and further filling the inter-pixel isolation trench 1802 (see FIG. 18), the intra-pixel isolation trenches 1702 (see FIG. 17), and the absorption enhancement openings 1602 (see FIG. 16). The backside dielectric layer 110 defines CBSI structures 102 in the intra-pixel isolation trenches 1702 and the absorption enhancement openings 1602, and further defines an inter-pixel trench isolation structure 116 in the inter-pixel isolation trench 1802. The backside dielectric layer 110 may be or comprise, for example, silicon oxide, a high k dielectric, some other suitable dielectric(s), or any combination of the foregoing. In some embodiments, the backside dielectric layer 110 is or comprises a material with a refractive index less than that of the semiconductor substrate 106 to promote TIR.

In some embodiments for forming of the backside dielectric layer 110 comprises: 1) depositing the backside dielectric layer 110; and 2) performing a planarization into an upper or top surface of the backside dielectric layer 110. The deposition may, for example, be performed by chemical vapor deposition (CVD), physical vapor deposition (PVD), sputtering, thermal oxidation, some other suitable deposition process(es), or any combination of the foregoing. The planarization may, for example, be performed by a chemical mechanical polish (CMP) and/or some other suitable planarization process(es).

Figure 20:
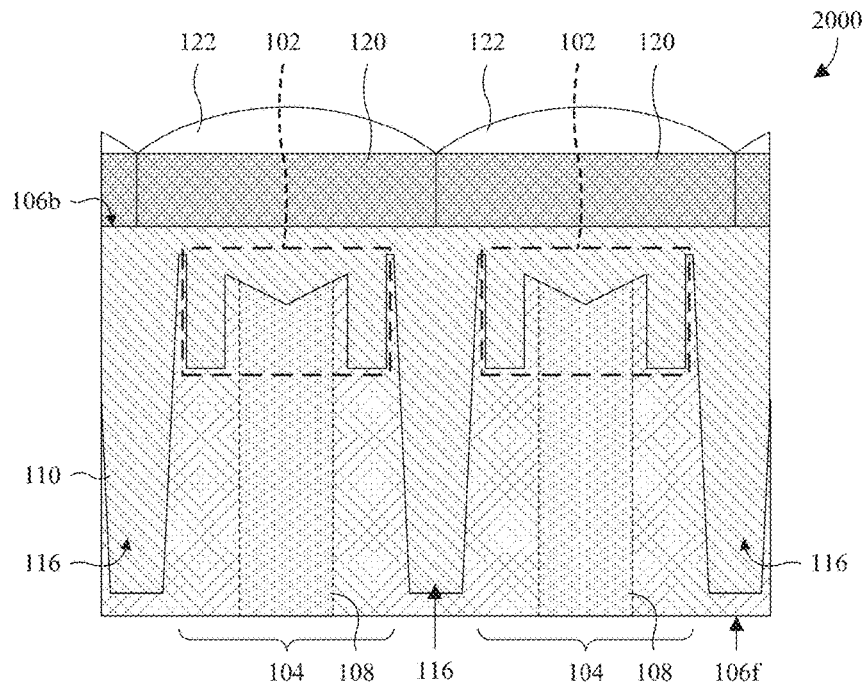

As illustrated by the cross-sectional view 2000 of FIG. 20, color filters 120 and microlenses 122 are formed stacked on the backside dielectric layer 110. For ease of illustration, only some of the color filters 120 are labeled 120 and only some of the microlenses 122 are labeled 122.

Although the cross-sectional views 1600-2000 shown in FIGS. 16-20 are described with reference to a method, it will be appreciated that the structures shown in FIGS. 16-20 are not limited to the method but rather may stand alone separate of the method. Although FIGS. 16-20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 21:
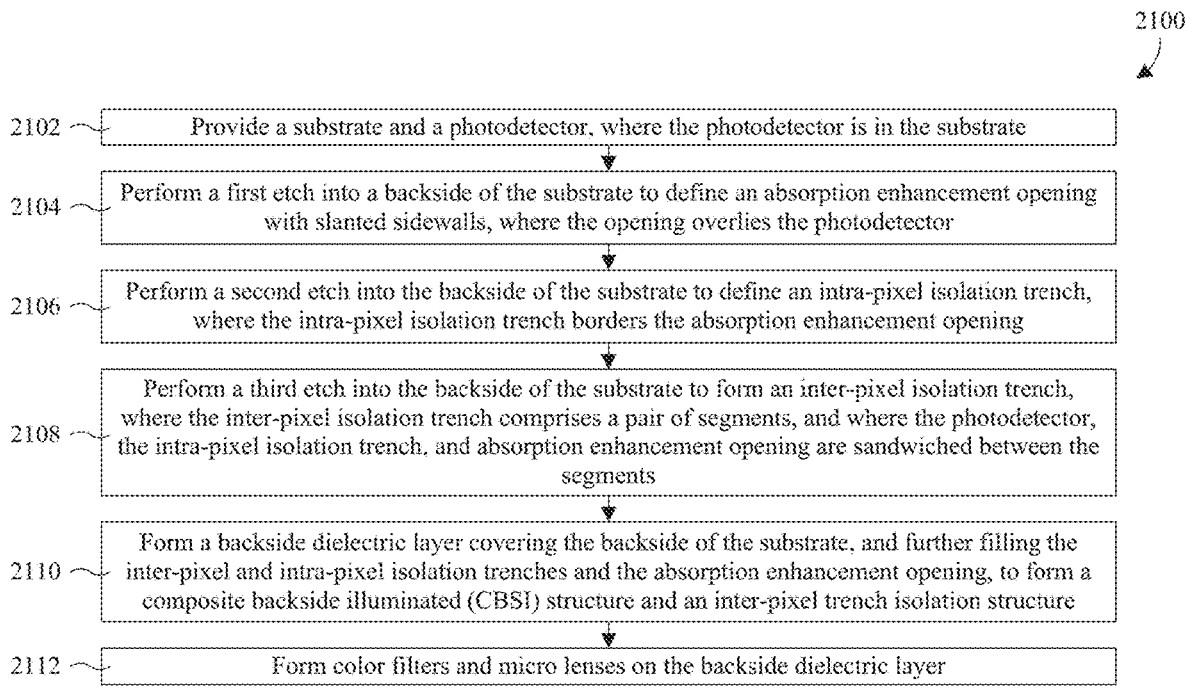
FIG. 21 illustrates a block diagram of some embodiments of the method of FIGS. 16-20.

With reference to FIG. 21, a block diagram 2100 of some embodiments of the method of FIGS. 16-20 is provided.

At 2102, a substrate and a photodetector are provided, where the photodetector is in the substrate. See, for example, FIG. 16.

At 2104, a first etch is performed into a backside of the substrate to define an absorption enhancement opening with slanted sidewalls, where the opening overlies the photodetector. See, for example, FIG. 16.

At 2106, a second etch is performed into the backside of the substrate to define an intra-pixel isolation trench, where the intra-pixel isolation trench borders the absorption enhancement opening. See, for example, FIG. 17.

At 2108, a third etch is performed into the backside of the substrate to form an inter-pixel isolation trench, where the inter-pixel isolation trench comprises a pair of segments, and where the photodetector, the intra-pixel isolation trench, and absorption enhancement opening are sandwiched between the segments. See, for example, FIG. 18.

At 2110, a backside dielectric layer is formed covering the backside of the substrate, and further filling the inter-pixel and intra-pixel isolation trenches and the absorption enhancement opening, to form a CBSI structure and inter-pixel trench isolation structure. See, for example, FIG. 19. A portion of the CBSI structure in the intra-pixel isolation trench (i.e., an intra-pixel trench isolation structure) prevents radiation from passing between pixel sensors and reflects radiation leaving the photodetector back to the photodetector. Similarly, a portion of the CBSI structure in the absorption enhancement opening (i.e., an absorption enhancement structure) reflects radiation leaving the photodetector back to the photodetector. The CBSI structure may, for example, achieve reflectance by TIR and has the effect of reducing cross talk, increasing absorption, and increasing quantum efficiency.

At 2112, color filters and micro lenses are formed on the backside dielectric layer. See, for example, FIG. 20.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 22-28 a series of cross-sectional views 2200-2800 of some alternative embodiments of a method for forming an image sensor comprising CBSI structures is provided in which the image sensor further comprises a composite grid. Further, inter-pixel trench isolation structures are formed after CBSI structures. The cross-sectional views 2200-2800 illustrate the method using the image sensor of FIG. 3A but may also be used to form the image sensor in any one of FIGS. 3B, 6A, 6B, 10, 14A, and 14B.

Figure 22:
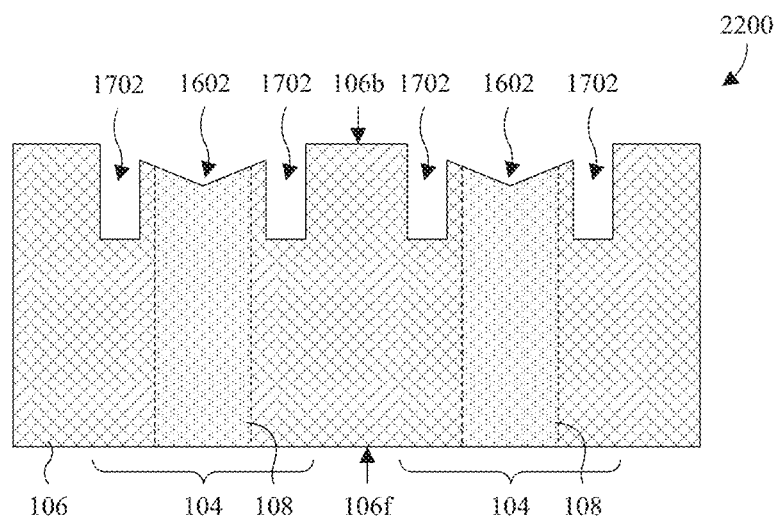
FIGS. 22-28 illustrate cross-sectional views of some alternative embodiments of a method for forming an image sensor comprising CBSI structures in which the image sensor further comprises a composite grid.

As illustrated by the cross-sectional view 2200 of FIG. 22, pixel sensors 104 are formed on a frontside 106f of a semiconductor substrate 106 and, in some embodiments, the semiconductor substrate 106 is thinned. Further, a backside 106b of the semiconductor substrate 106 is patterned to form absorption enhancement openings 1602 and intra-pixel isolation trenches 1702. The absorption enhancement openings 1602 and the intra-pixel isolation trenches 1702 may, for example, be as described with regard to FIGS. 16 and 17 and/or may, for example, be formed as described with regard to FIGS. 16 and 17.

Figure 23:
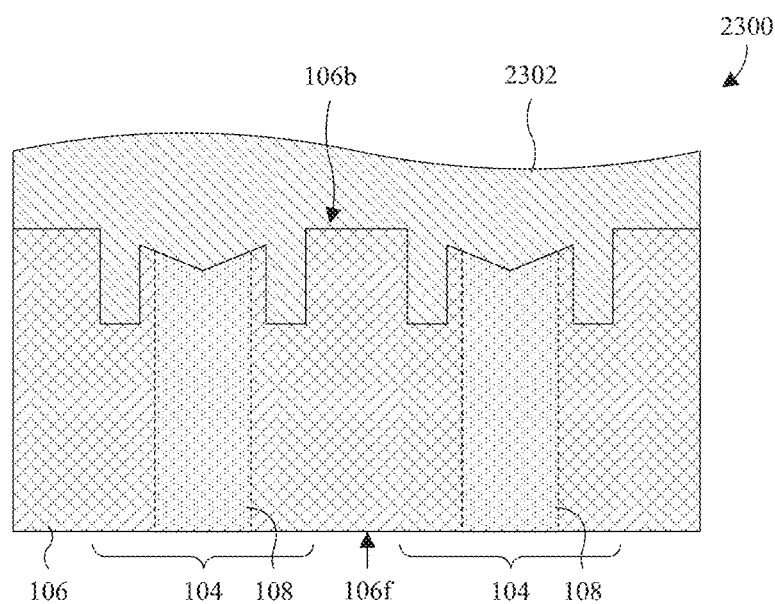

As illustrated by the cross-sectional view 2300 of FIG. 23, a CBSI layer 2302 is formed covering the backside 106b of the semiconductor substrate 106, and further filling the absorption enhancement openings 1602 (see FIG. 22) and the intra-pixel isolation trenches 1702 (see FIG. 22). The CBSI layer 2302 may, for example, be or comprise silicon oxide and/or some other suitable dielectric(s). Further, the CBSI layer 2302 may, for example, have a refractive index less than that of the semiconductor substrate 106. In some embodiments, the CBSI layer 2302 is formed by CVD, PVD, thermal oxidation, some other suitable deposition process(es), or any combination of the foregoing.

Figure 24:
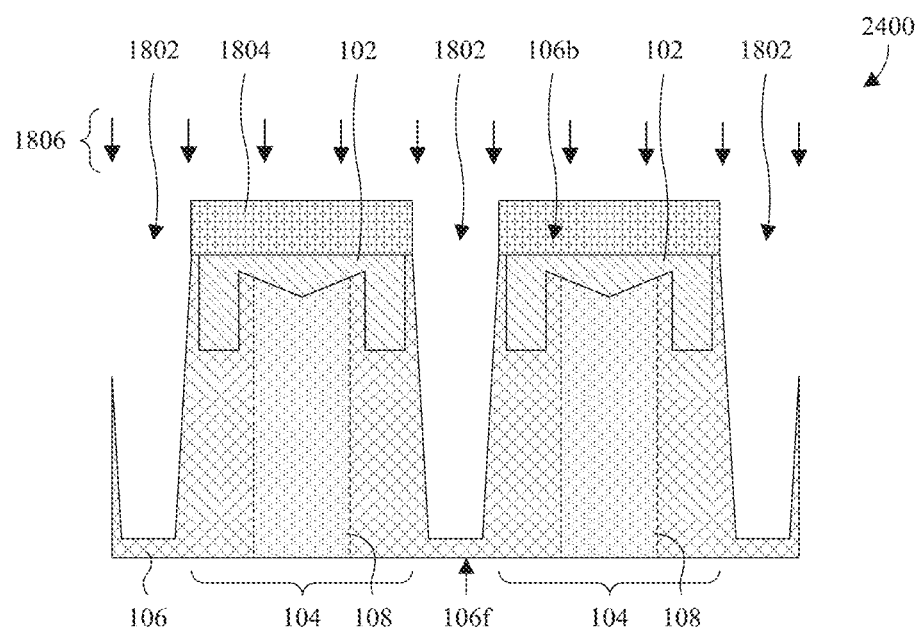

As illustrated by the cross-sectional view 2400 of FIG. 24, a planarization is performed into the CBSI layer 2302 (see FIG. 23) until the semiconductor substrate 106 is reached to form CBSI structures 102. Further, the backside 106b of the semiconductor substrate 106 is patterned to form an inter-pixel isolation trench 1802. The inter-pixel isolation trench 1802 separates the pixel sensors 104 from each other and may, for example, be formed as described with regard to FIG. 18. The planarization may, for example, be performed by a CMP or some other suitable planarization process.

Figure 25:
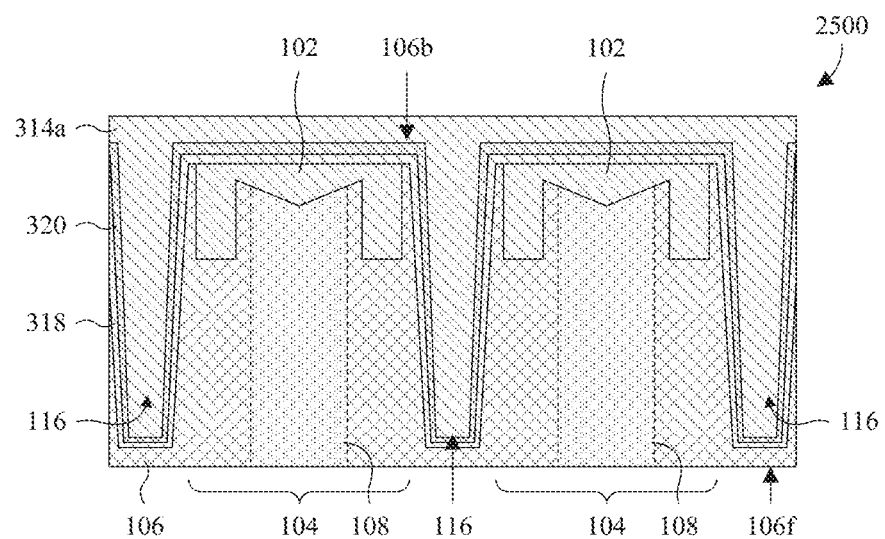

As illustrated by the cross-sectional view 2500 of FIG. 25, a first backside liner 318, a second backside liner 320, and a first backside dielectric layer 314a are formed. The first and second backside liners 318, 320 line the inter-pixel isolation trench 1802 (see FIG. 24), and the first backside dielectric layer 314a fills the inter-pixel isolation trench 1802 over the first and second backside liners 318, 320. The first backside liner 318, the second backside liner 320, and the first backside dielectric layer 314a collectively define an inter-pixel trench isolation structure 116 in the inter-pixel isolation trench 1802. The first backside liner 318 and/or the first backside dielectric layer 314a may be or comprise, for example, silicon oxide and/or some other suitable dielectric(s). In some embodiments, the first backside liner 318 and the first backside dielectric layer 314a are the same material. The second backside liner 320 may be or comprise, for example, a high k dielectric and/or some other suitable dielectric(s).

The first and second backside liners 318, 320 may, for example, be formed by CVD, PVD, thermal oxidation, some other suitable deposition process(es), or any combination of the foregoing. The first backside dielectric layer 314a may, for example, be formed by depositing the first backside dielectric layer 314a and subsequently perform a planarization into the first backside dielectric layer 314a. The planarization may, for example, be performed by a CMP or some other suitable planarization process.

In alternative embodiments, the formation of the CBSI layer 2302 at FIG. 23 and the planarization at FIG. 24 are omitted. In such alternative embodiments, the first backside liner 318 and the second backside liner 320 line the absorption enhancement openings 1602 (see FIG. 22) and the intra-pixel isolation trenches 1702 (see FIG. 22). Further, the first backside dielectric layer 314a fills the absorption enhancement openings 1602 and the intra-pixel isolation trenches 1702 over the first backside liner 318 and the second backside liner 320. Accordingly, the CBSI structures 102 may, for example, be defined by the first backside liner 318, the second backside liner 320, and the first backside dielectric layer 314a in alternative embodiments.

Figure 26:
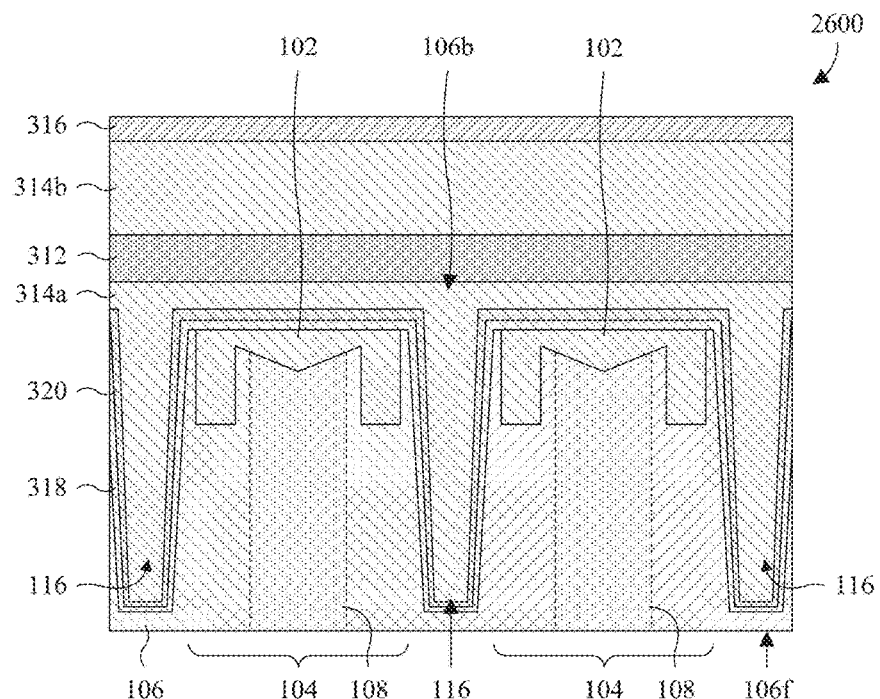

As illustrated by the cross-sectional view 2600 of FIG. 26, a metal layer 312, a second backside dielectric layer 314b, and a hard mask layer 316 (collectively a composite grid film) are formed stacked on the first backside dielectric layer 314a.

Figure 27:
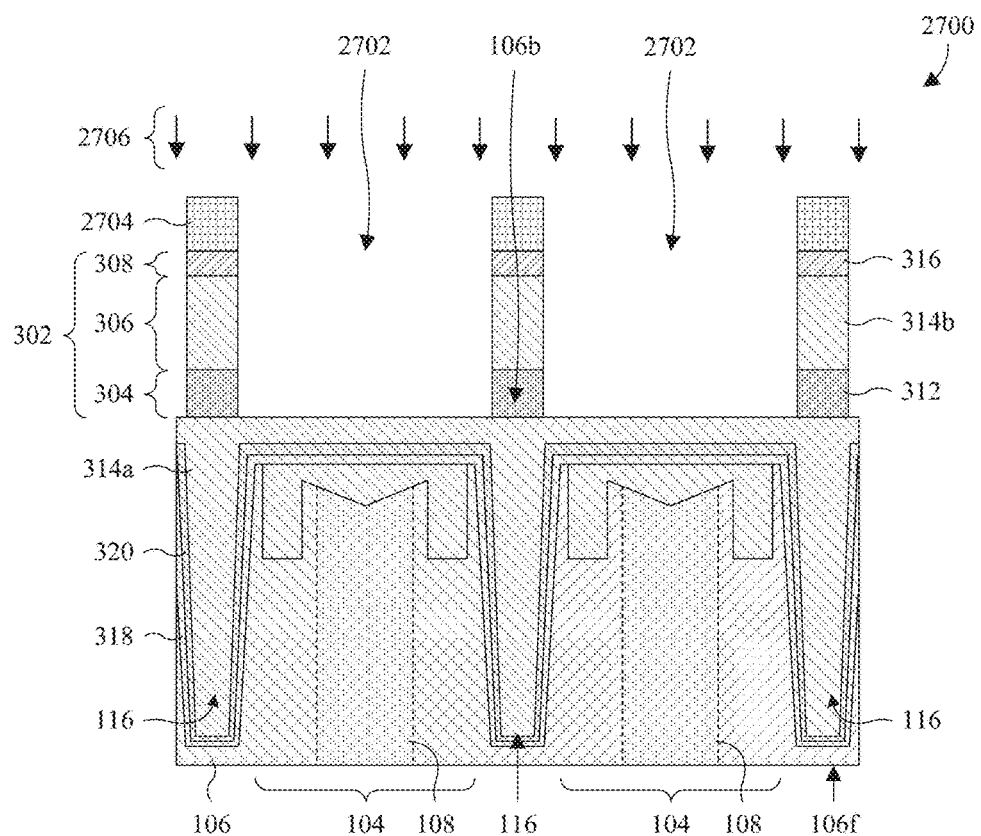

As illustrated by the cross-sectional view 2700 of FIG. 27, the metal layer 312, the second backside dielectric layer 314b, and the hard mask layer 316 are patterned to define a composite grid 302 and to form color filter openings 2702 overlying the pixel sensors 104. In some embodiments, the patterning is performed by an etching process or some other suitable patterning process. The etching process may, for example, comprise: 1) forming a mask 2704 on the hard mask layer 316; 2) applying one or more etchants 2706 with the mask 2704 in place; and 3) stripping the mask 2704.

Figure 28:
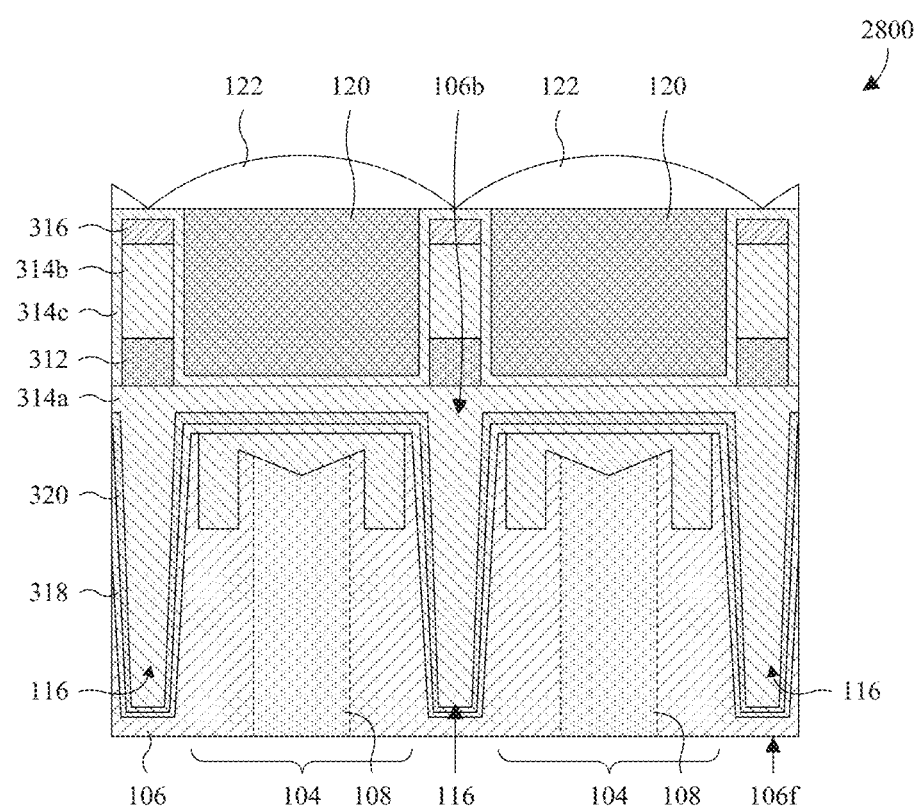

As illustrated by the cross-sectional view 2800 of FIG. 28, a composite grid liner 314c is formed covering the hard mask layer 316 and lining the color filter openings 2702 (see FIG. 27). Further, color filters 120 are formed filling the color filter openings 2702 over the composite grid liner 314c and microlenses 122 are formed on the color filters 120. The composite grid liner 314c may be or comprise, for example, silicon oxide and/or some other suitable dielectric(s).

Although the cross-sectional views 2200-2800 shown in FIGS. 22-28 are described with reference to a method, it will be appreciated that the structures shown in FIGS. 22-28 are not limited to the method but rather may stand alone separate of the method. Although FIGS. 22-28 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 29:
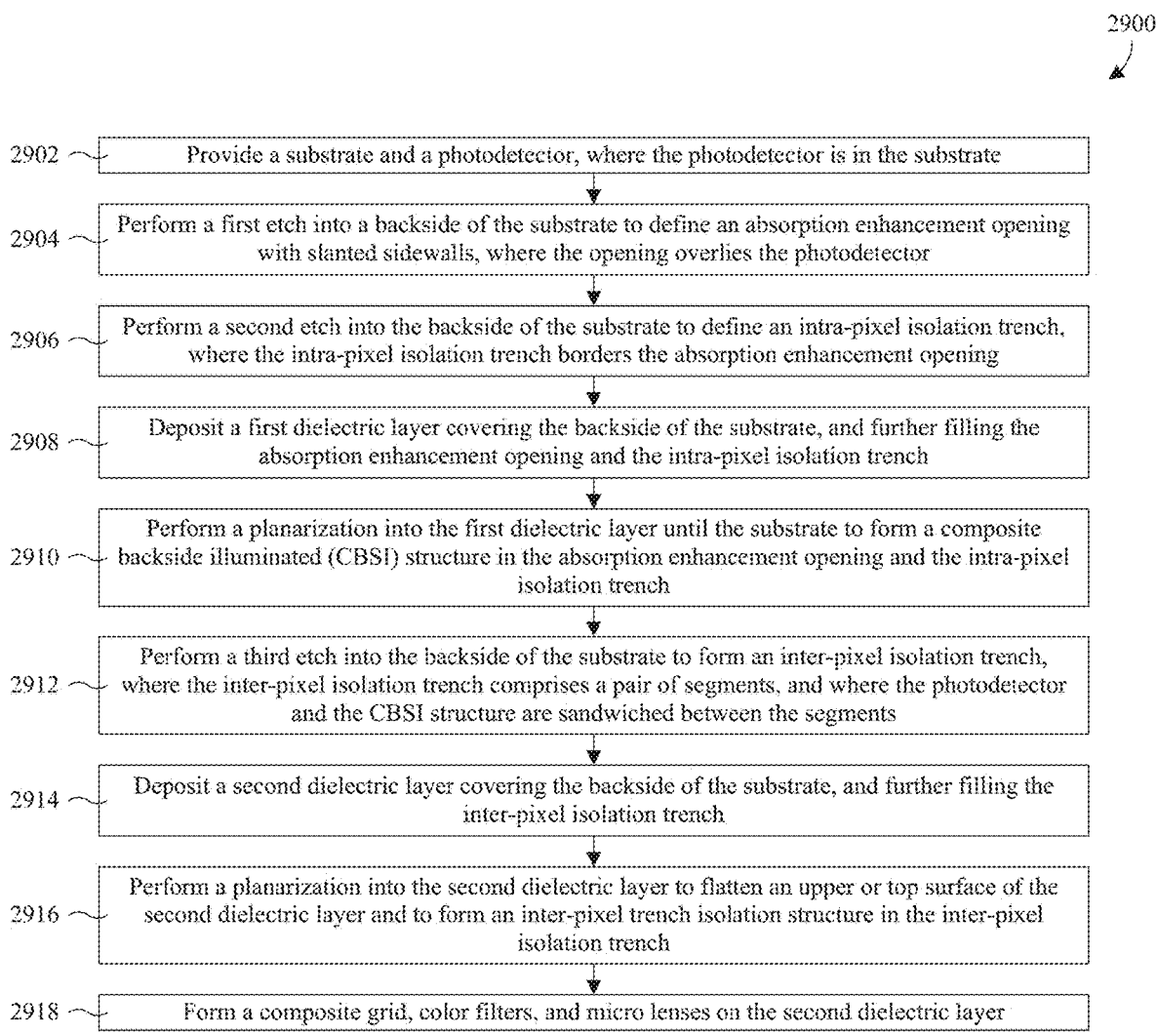
FIG. 29 illustrates a block diagram of some embodiments of the method of FIGS. 22-28.

With reference to FIG. 29, a block diagram 2900 of some embodiments of the method of FIGS. 22-28 is provided.

At 2902, a substrate and a photodetector are provided, where the photodetector is in the substrate. See, for example, FIG. 22.

At 2904, a first etch is performed into a backside of the substrate to define an absorption enhancement opening with slanted sidewalls, where the opening overlies the photodetector. See, for example, FIG. 22.

At 2906, a second etch is performed into the backside of the substrate to define an intra-pixel isolation trench, where the intra-pixel isolation trench borders the absorption enhancement opening. See, for example, FIG. 22.

At 2908, a first dielectric layer is formed covering the backside of the substrate, and further filling the absorption enhancement opening and the intra-pixel isolation trench. See, for example, FIG. 23.

At 2910, a planarization is performed into the first dielectric layer until the substrate to form a CBSI structure in the absorption enhancement opening and the intra-pixel isolation trench. See, for example, FIG. 24. The CBSI structure serves as a reflector to confine radiation to the substrate using, for example, TIR. By confining radiation, the CBSI structure reduces cross talk, increases absorption, and increases quantum efficiency.

At 2912, a third etch is performed into the backside of the substrate to form an inter-pixel isolation trench, where the inter-pixel isolation trench comprises a pair of segments, and where the photodetector and the CBSI structure are sandwiched between the segments. See, for example, FIG. 24.

At 2914, a second dielectric layer is deposited covering the backside of the substrate, and further filling the inter-pixel isolation trench. See, for example, FIG. 25.

At 2916, a planarization is performed into the second dielectric layer to flatten an upper or top surface of the second dielectric layer and to form an inter-pixel trench isolation structure in the inter-pixel isolation trench. See, for example, FIG. 25.

At 2918, a composite grid, color filters, and micro lenses are formed on the second dielectric layer. See, for example, FIGS. 26-28.

While the block diagram 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 30-46, a series of cross-sectional views 3000-4600 of some embodiments of a method for forming a 3D BSI image sensor comprising CBSI structures is provided. The cross-sectional views 3000-4600 illustrate the method using the 3D BSI image sensor of FIG. 15 but may also be used to form alternative embodiments of the 3D BSI image sensor with embodiments of the CBSI structures in any one of the preceding figures.

Figure 30:
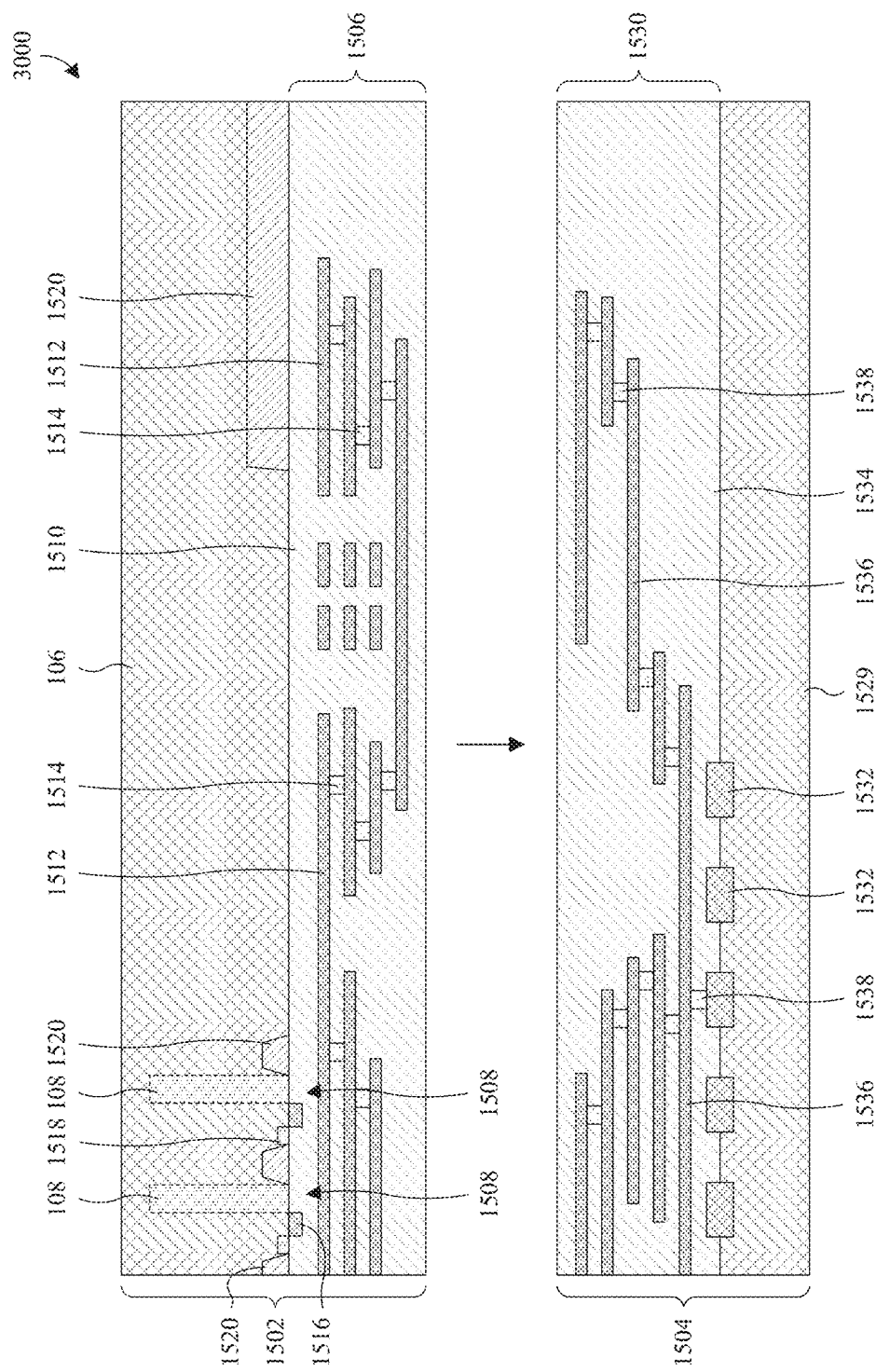
FIGS. 30-46 illustrate cross-sectional views of some embodiments of a method for forming a 3D BSI image sensor comprising CBSI structures to enhance performance.

As illustrated by the cross-sectional view 3000 of FIG. 30, a first integrated chip 1502 and a second integrated chip 1504 are bonded together frontside to frontside. The first and second integrated chips 1502, 1504 may, for example, be as described with regard to FIG. 15. The bonding may, for example, be performed by fusion bonding, hybrid bonding, or some other suitable bonding process.

Figure 31:
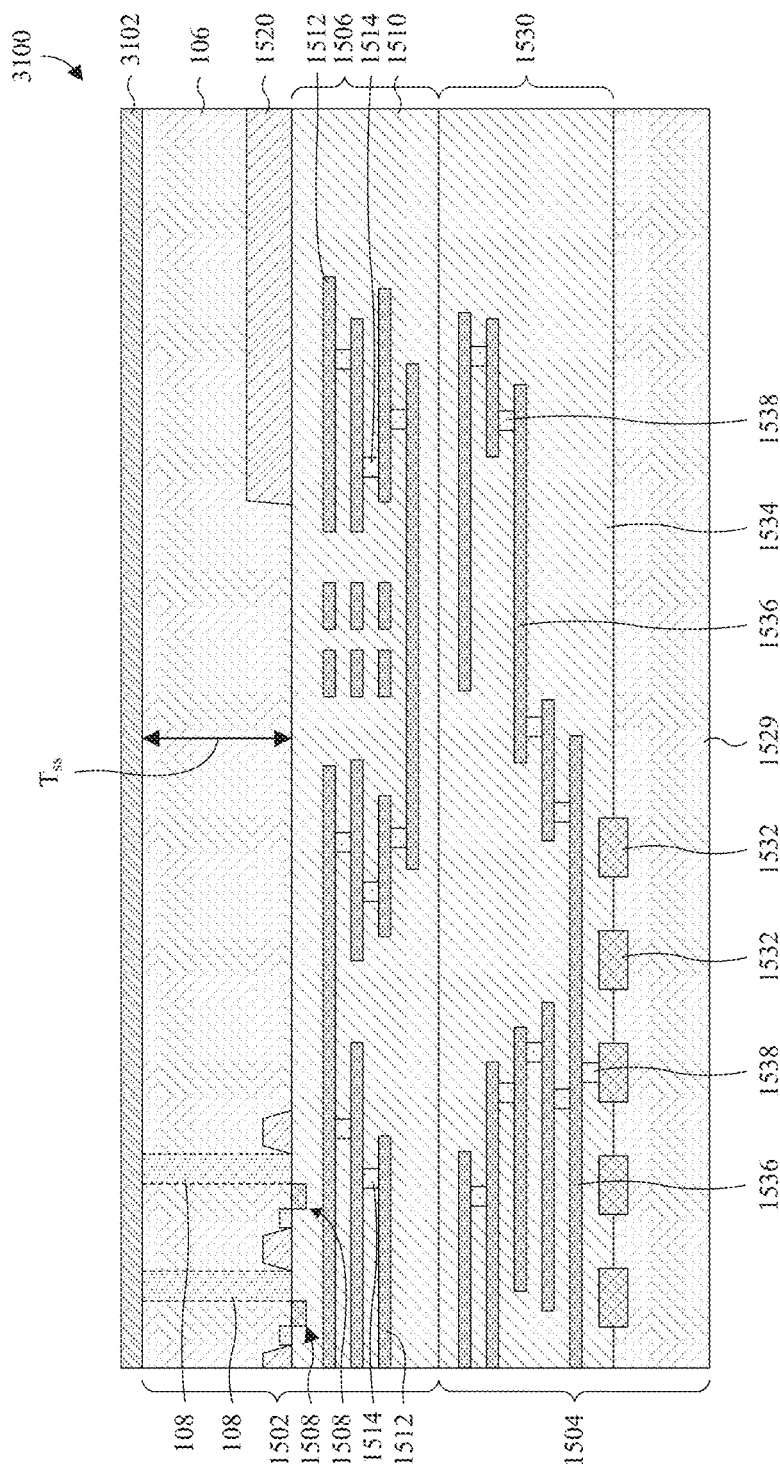

As illustrated by the cross-sectional view 3100 of FIG. 31, a first substrate 106 of the first integrated chip 1502 is thinned to reduce a thickness $T_{ss}$ of the first substrate 106. The thickness $T_{ss}$ may, for example, be reduced to about 2.5 micrometers or some other suitable thickness. Also illustrated, a sacrificial dielectric layer 3102 is formed on a backside of the first substrate 106. The sacrificial dielectric layer 3102 may, for example, be or comprise silicon oxide and/or some other suitable dielectric(s).

Figure 32:
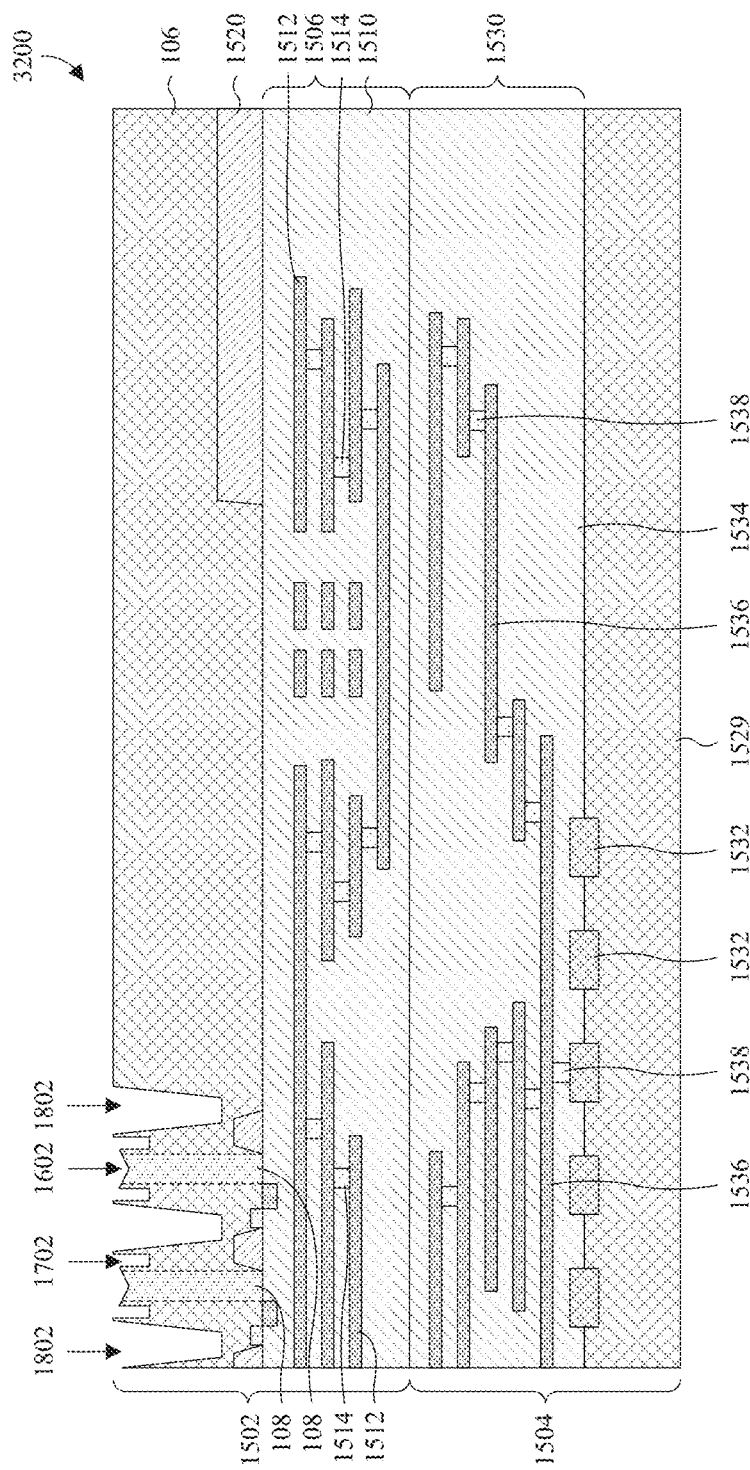

As illustrated by the cross-sectional view 3200 of FIG. 32, a backside of the first substrate 106 is patterned to form absorption enhancement openings 1602 and intra-pixel isolation trenches 1702 overlying the photodetectors 108, and to further form an inter-pixel isolation trench 1802 separating the photodetectors 108. The patterning may, for example, be performed according to the acts illustrated and described with regard to FIGS. 16-18. Also, the sacrificial dielectric layer 3102 (see FIG. 31) is removed by, for example, an etching process, a cleaning process, or some other suitable removal process.

Figure 33:
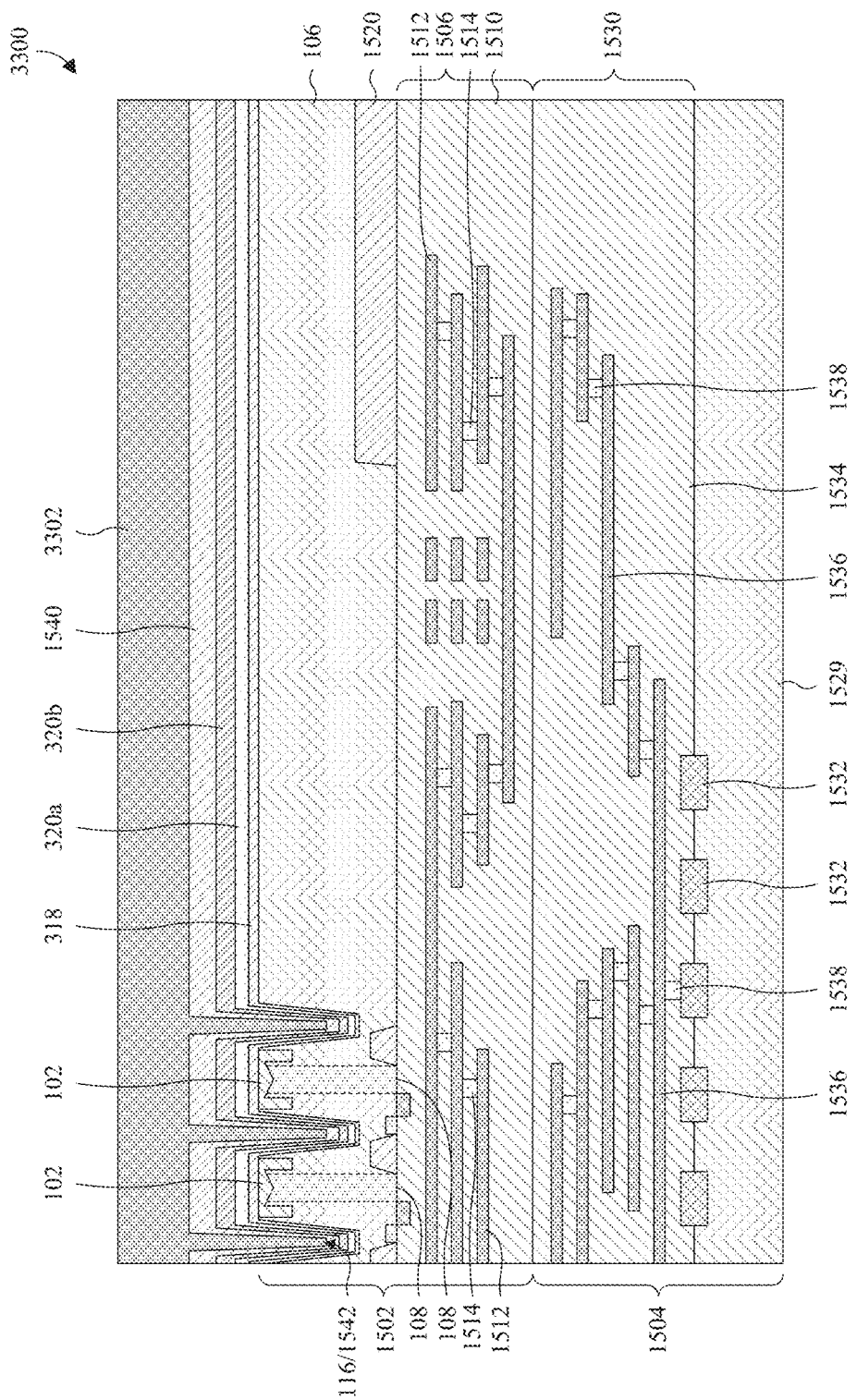

As illustrated by the cross-sectional view 3300 of FIG. 33, a first backside liner 318, a pair of second backside liners 320*a*, 320*b*, a third backside liner 1540, and a metal layer 3302 are formed stacked on the backside of the first substrate 106, filling the absorption enhancement openings 1602 (see FIG. 32), the intra-pixel isolation trenches 1702 (see FIG. 32), and the inter-pixel isolation trench 1802 (see FIG. 32). This forms CBSI structures 102 in the absorption enhancement openings 1602 and the intra-pixel isolation trenches 1702, and further forms an inter-pixel trench isolation structure 116 in the inter-pixel isolation trench 1802 and a first metal grid 1542 in the inter-pixel isolation trench 1802. Note that because of the scale of the absorption enhancement openings 1602 and the intra-pixel isolation trenches 1702, it was impractical to show the first backside liner 318, the pair of second backside liners 320*a*, 320*b*, and third backside liner 1540 in the absorption enhancement openings 1602 and the intra-pixel isolation trenches 1702. Hence, the hashing of the CBSI structures 102 has been varied and represents the first backside liner 318, one or both of the second backside liners 320*a*, 320*b*, the third backside liner 1540, or any combination of the foregoing.

In alternative embodiments, the absorption enhancement openings 1602 and the intra-pixel isolation trenches 1702 are filled with a dielectric material before forming the first backside liner 318. For example, the dielectric material may be deposited and planarized before forming the first backside liner 318. An example of this is show at FIGS. 23 and 24.

Figure 34:
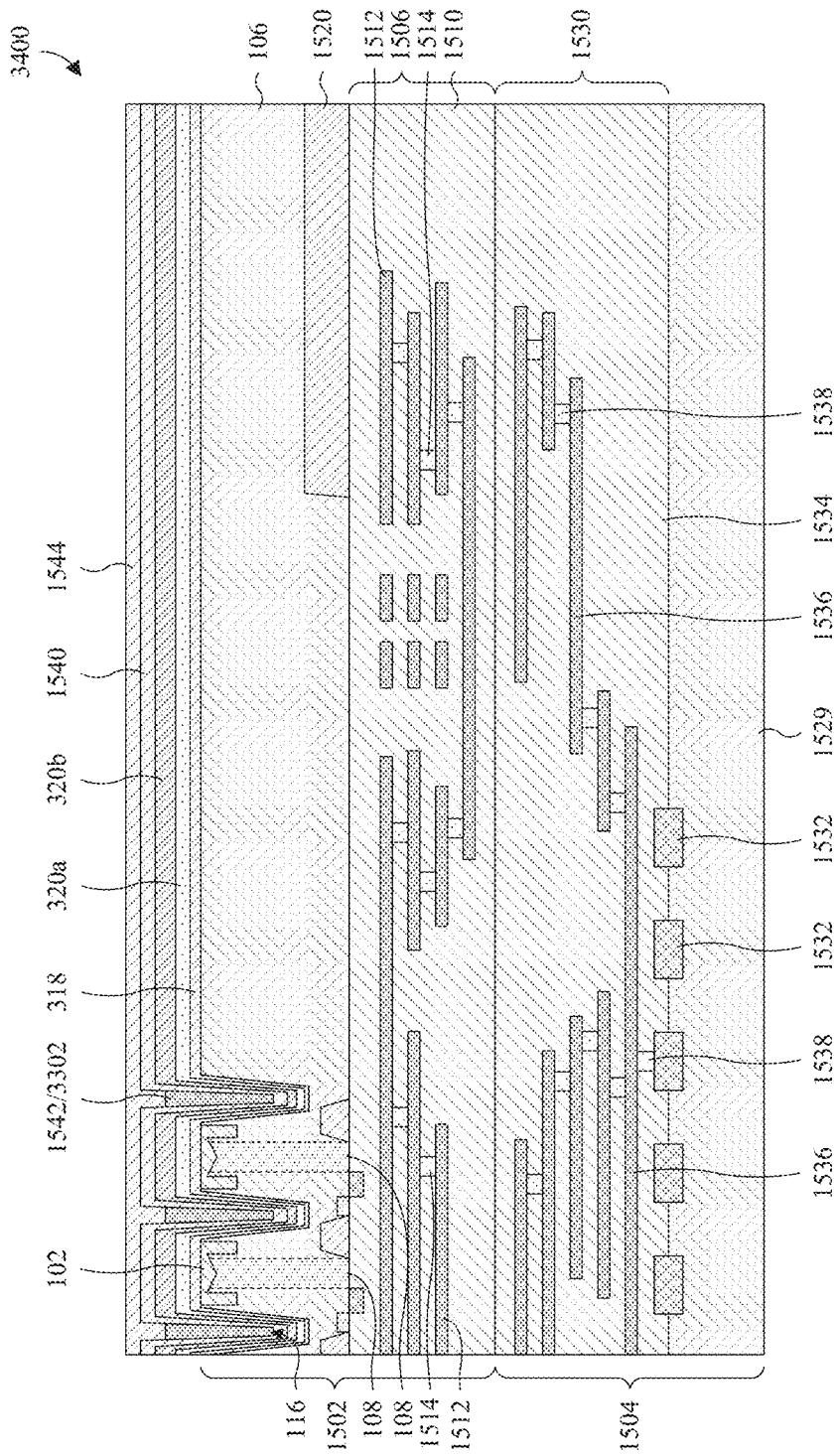

As illustrated by the cross-sectional view 3400 of FIG. 34, an etch back is performed into the metal layer 3302 to recess a top surface of the metal layer 3302 to below a top surface of the third backside liner 1540. The etch back may, for example, also thin the third backside liner 1540. Additionally, after the etch back, a cap layer 1544 is formed covering the third backside liner 1540 and the first metal grid 1542. In some embodiments, formation of the cap layer 1544 comprises depositing the cap layer 1544 and subsequently performing a planarization into the cap layer. Other processes are, however, amenable.

Figure 35:
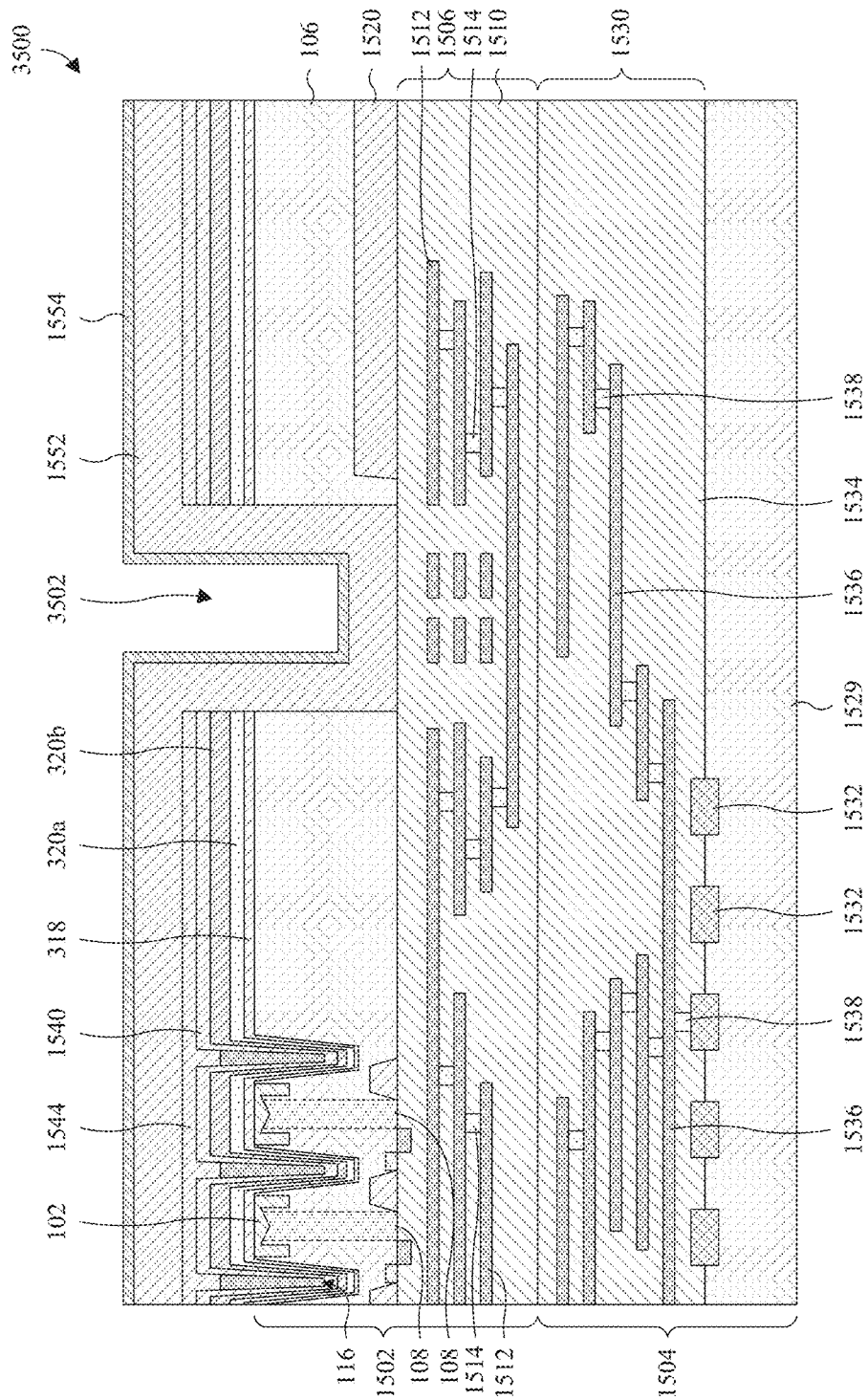

As illustrated by the cross-sectional view 3500 of FIG. 35, a patterning process is performed on the backside of the first substrate 106 to form a TSV opening 3502. The patterning process may, for example, be performed by a photolithography/etching process or some other suitable patterning process. Also, a pair of TSV liners 1552, 1554 are formed covering the cap layer 1544 and lining the TSV opening 3502.

Figure 36:
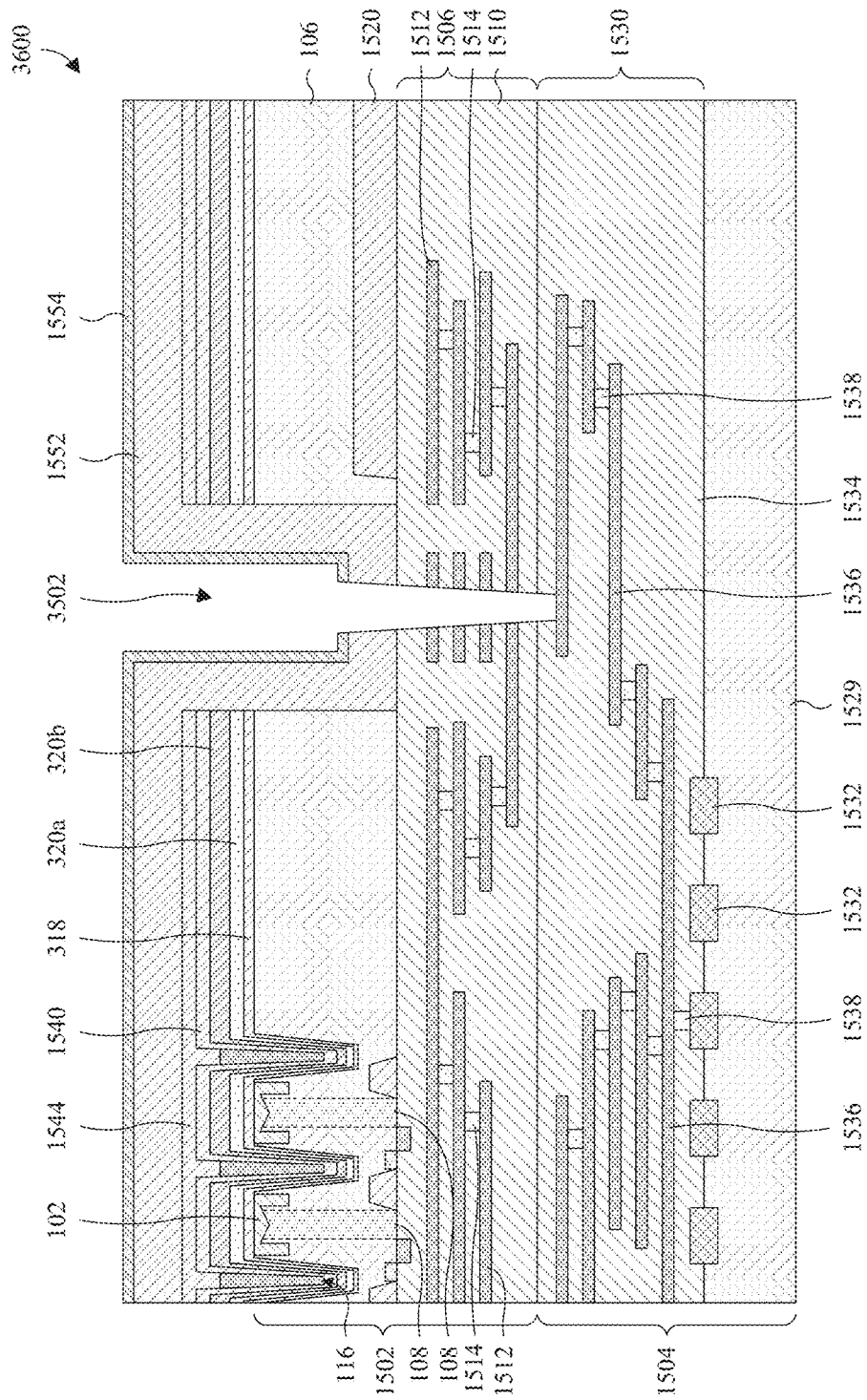

As illustrated by the cross-sectional view 3600 of FIG. 36, a patterning process is performed on the backside of the first substrate 106 to extend the TSV opening 3502 to a second interconnect structure 1530 of the second integrated chip 1504. The patterning process may, for example, be performed by a photolithography/etching process or some other suitable patterning process.

Figure 37:
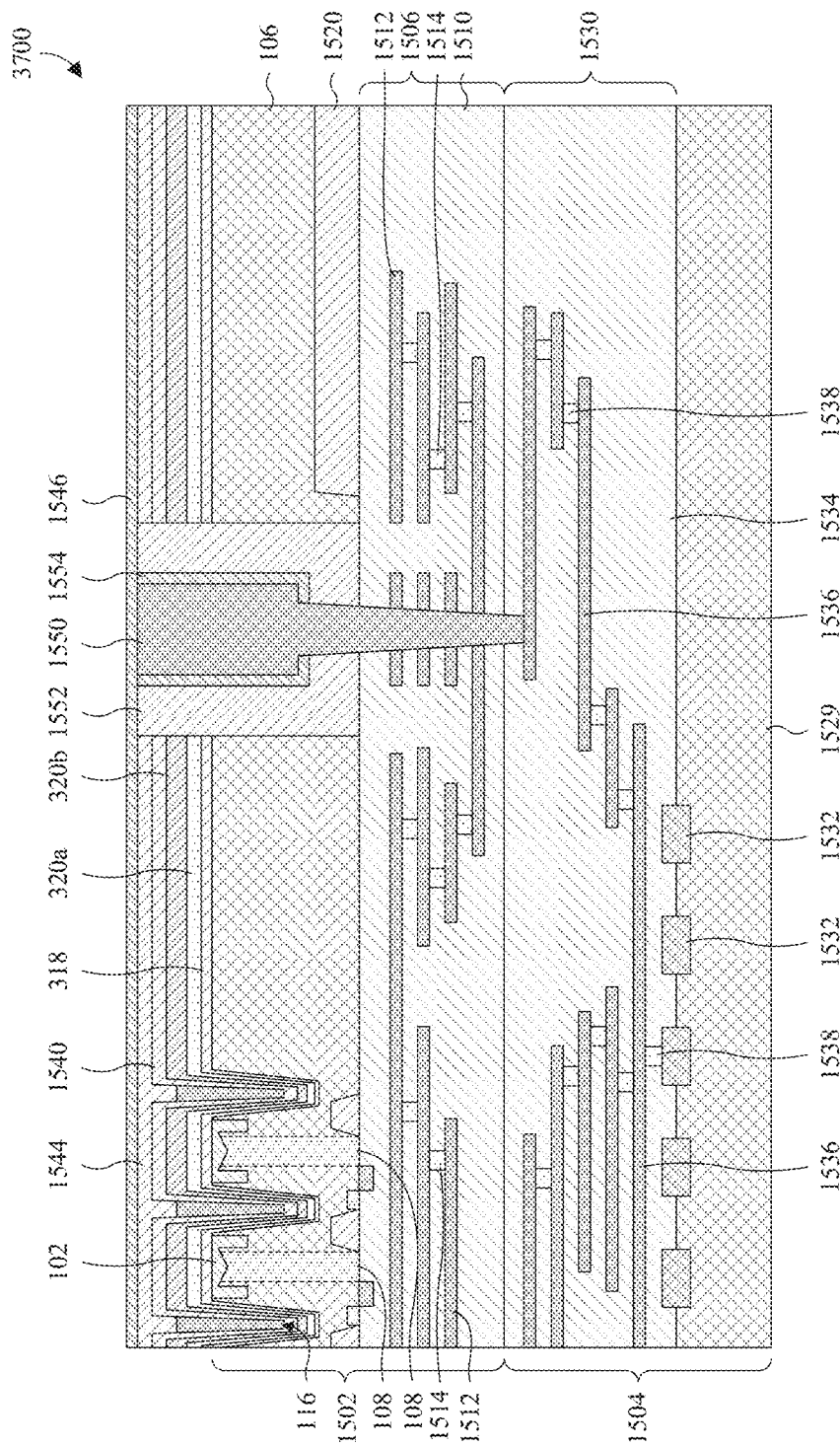

As illustrated by the cross-sectional view 3700 of FIG. 37, the TSV opening 3502 (see FIG. 36) is filled by a conductive material to form a TSV 1550 in the TSV opening 3502. A process for filling the TSV opening 3502 may, for example, comprise depositing a conductive layer filling the TSV opening 3502 and performing a planarization into the conductive layer. Additionally, an etch stop layer 1546 is formed covering the TSV 1550, the cap layer 1544, and the TSV liners 1552, 1554.

Figure 38:
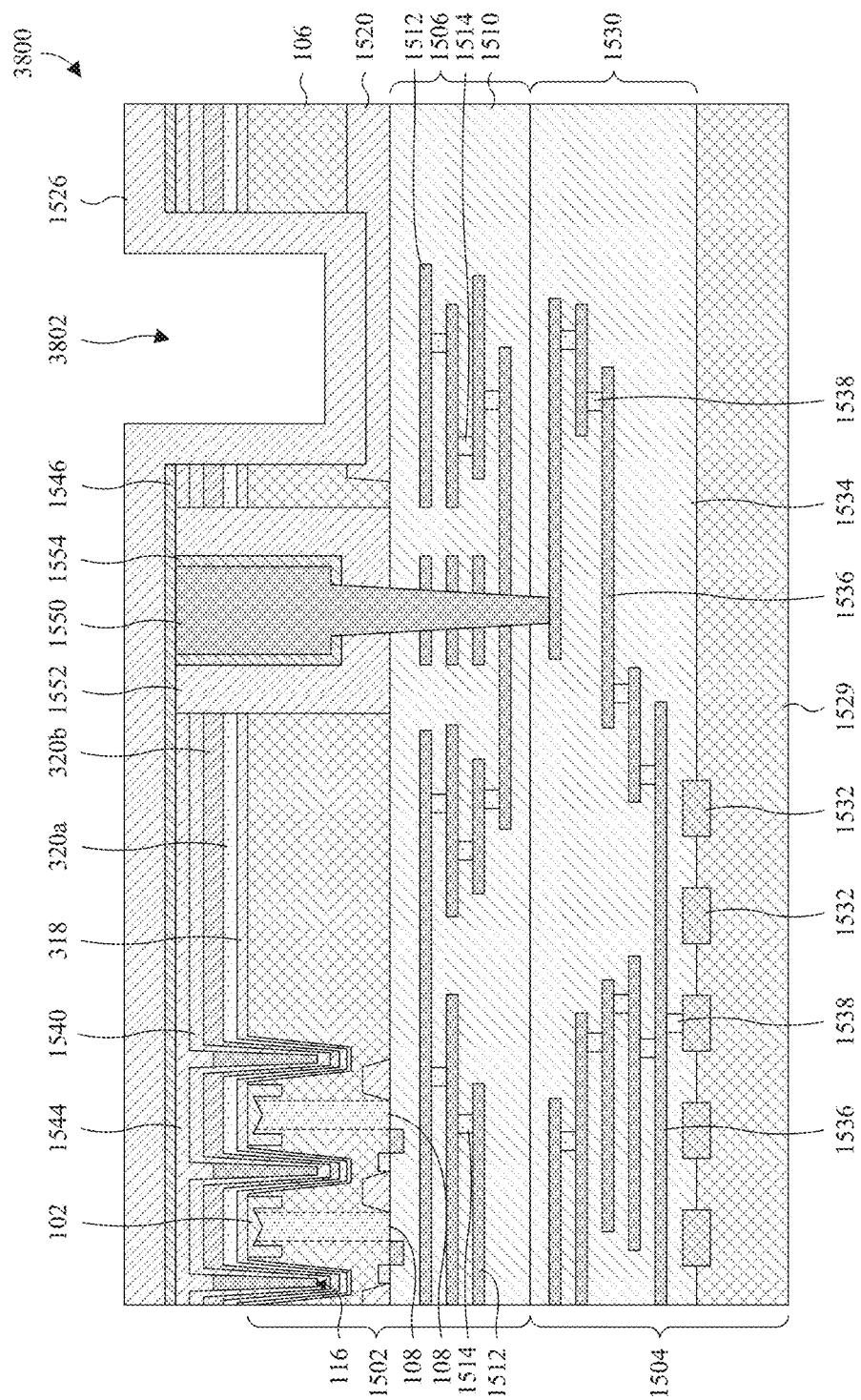

As illustrated by the cross-sectional view 3800 of FIG. 38, a patterning process is performed on the backside of the first substrate 106 to form a first pad opening 3802. The patterning process may, for example, be performed by a photolithography/etching process or some other suitable patterning process. Also, a pad dielectric liner 1526 is formed covering the etch stop layer 1546 and lining the first pad opening 3802.

Figure 39:
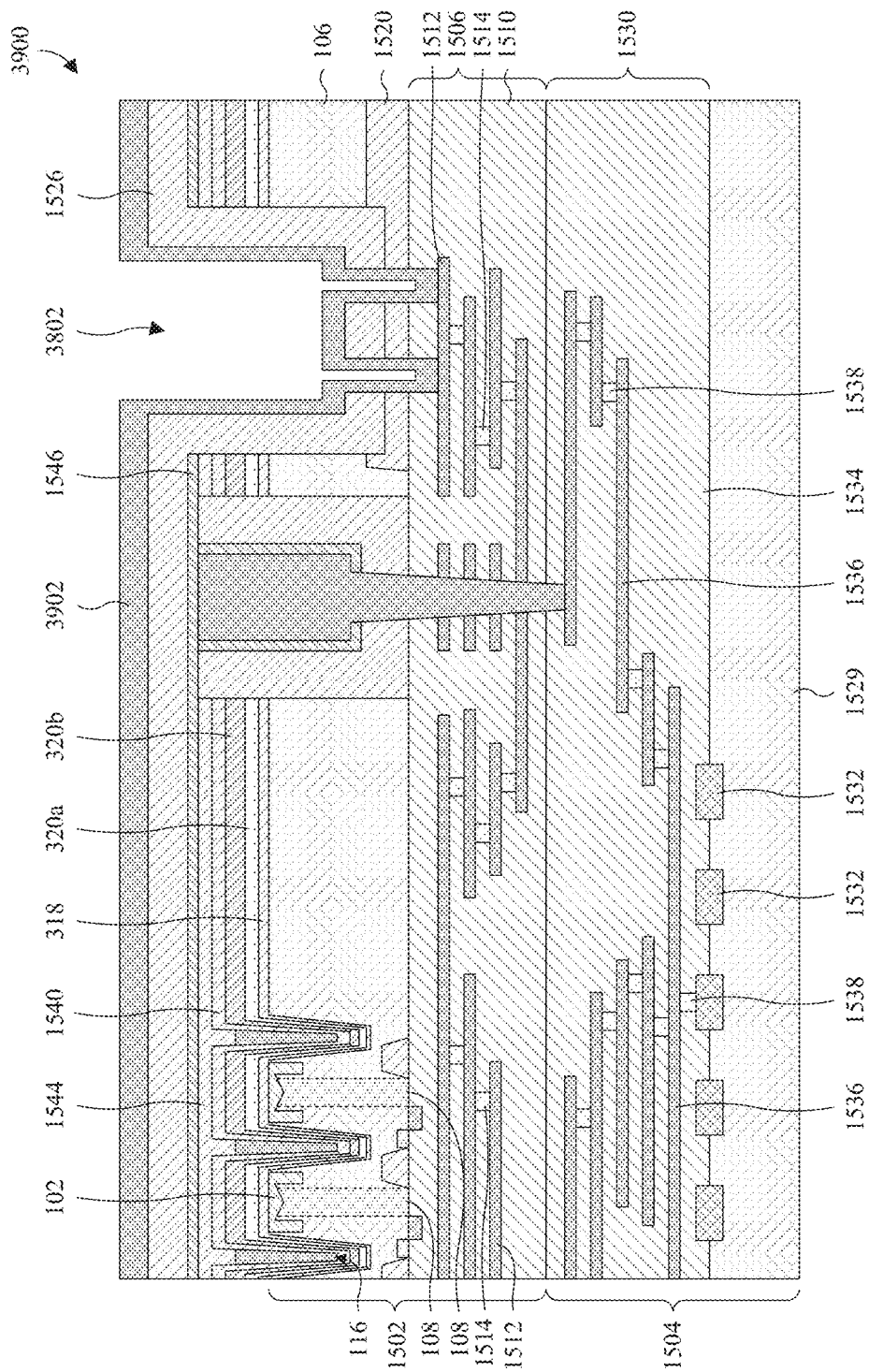

As illustrated by the cross-sectional view 3900 of FIG. 39, a patterning process is performed on the backside of the first substrate 106 to extend the first pad opening 3802 to a first interconnect structure 1506 of the first integrated chip 1502. The patterning process may, for example, be performed by a photolithography/etching process or some other suitable patterning process. Also, a pad layer 3902 is formed covering the pad dielectric liner 1526 and lining the first pad opening 3802 (as extended) over the pad dielectric liner 1526.

Figure 40:
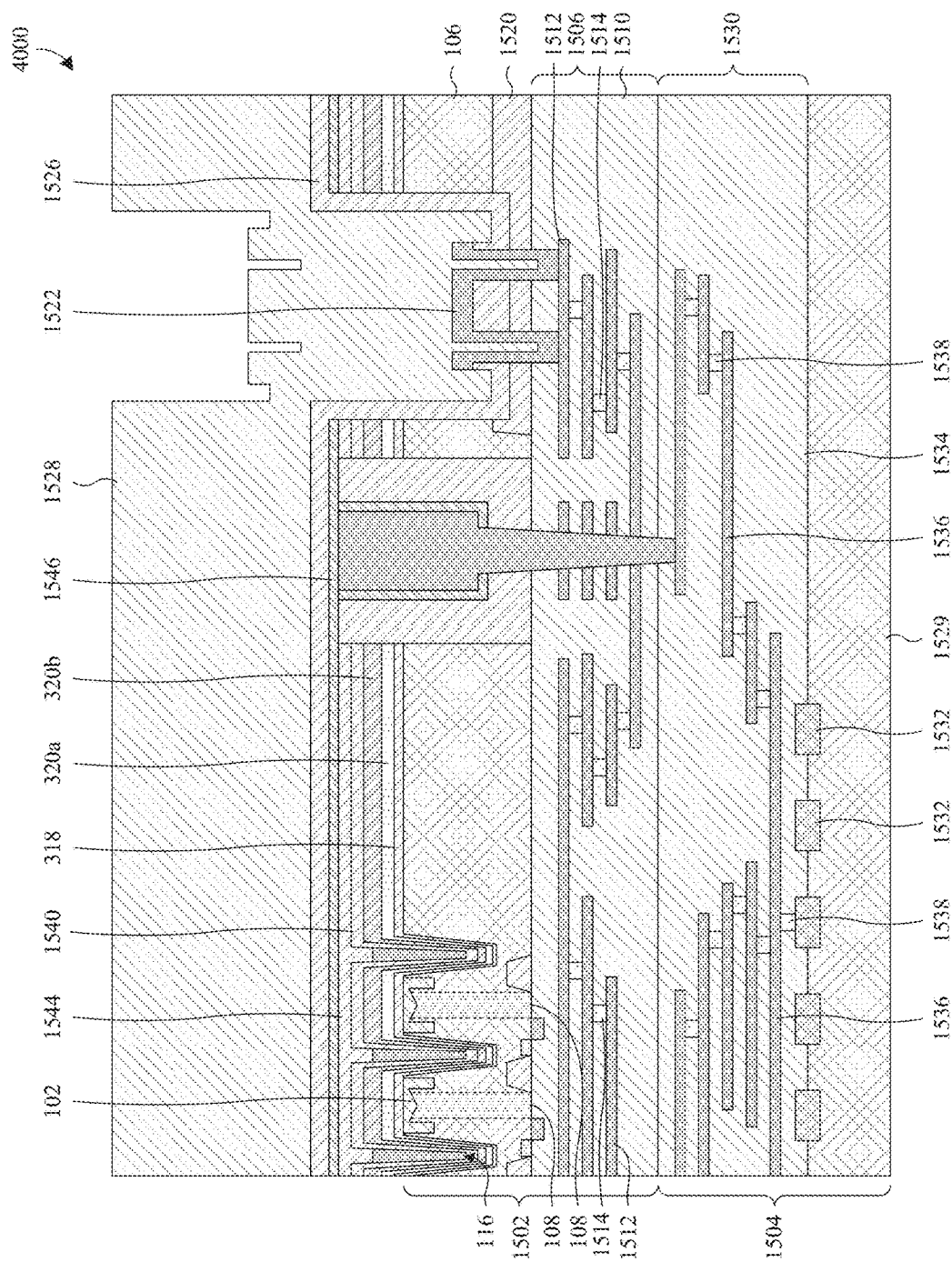

As illustrated by the cross-sectional view 4000 of FIG. 40, the pad layer 3902 is patterned into a pad structure 1522. The patterning may, for example, also thin the pad dielectric liner 1526 and/or may, for example, be performed by a photolithography/etching process or some other suitable patterning process. Also, a pad dielectric layer 1528 is formed filling the first pad opening 3802 (see FIG. 39) over the pad structure 1522.

Figure 41:
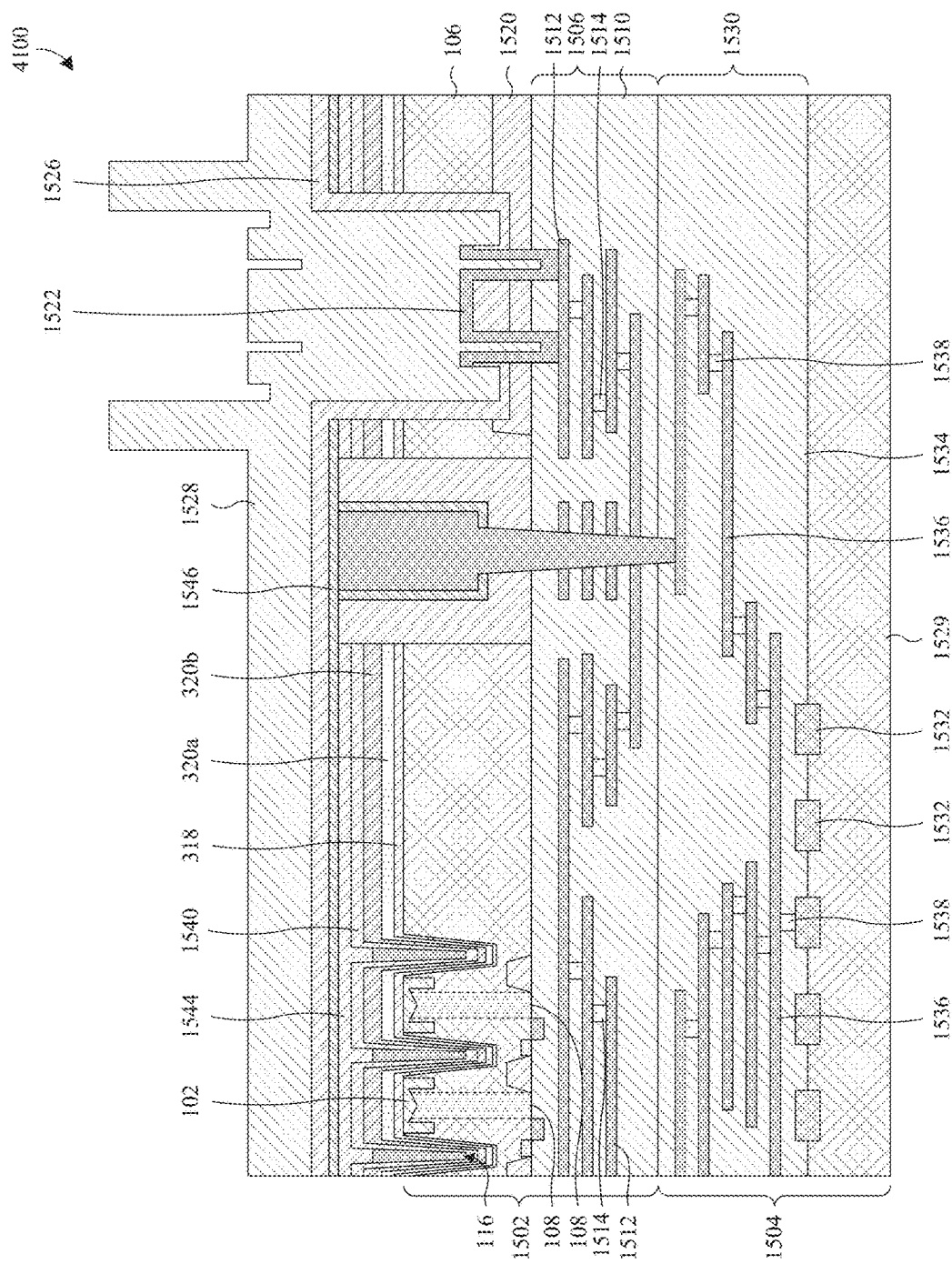

As illustrated by the cross-sectional view 4100 of FIG. 41, the pad dielectric layer 1528 is patterned to partially remove portions of the pad dielectric layer 1528 to sides of the pad structure 1522. The patterning may, for example, be a performed by a photolithography/etching process or some other suitable patterning process.

Figure 42:
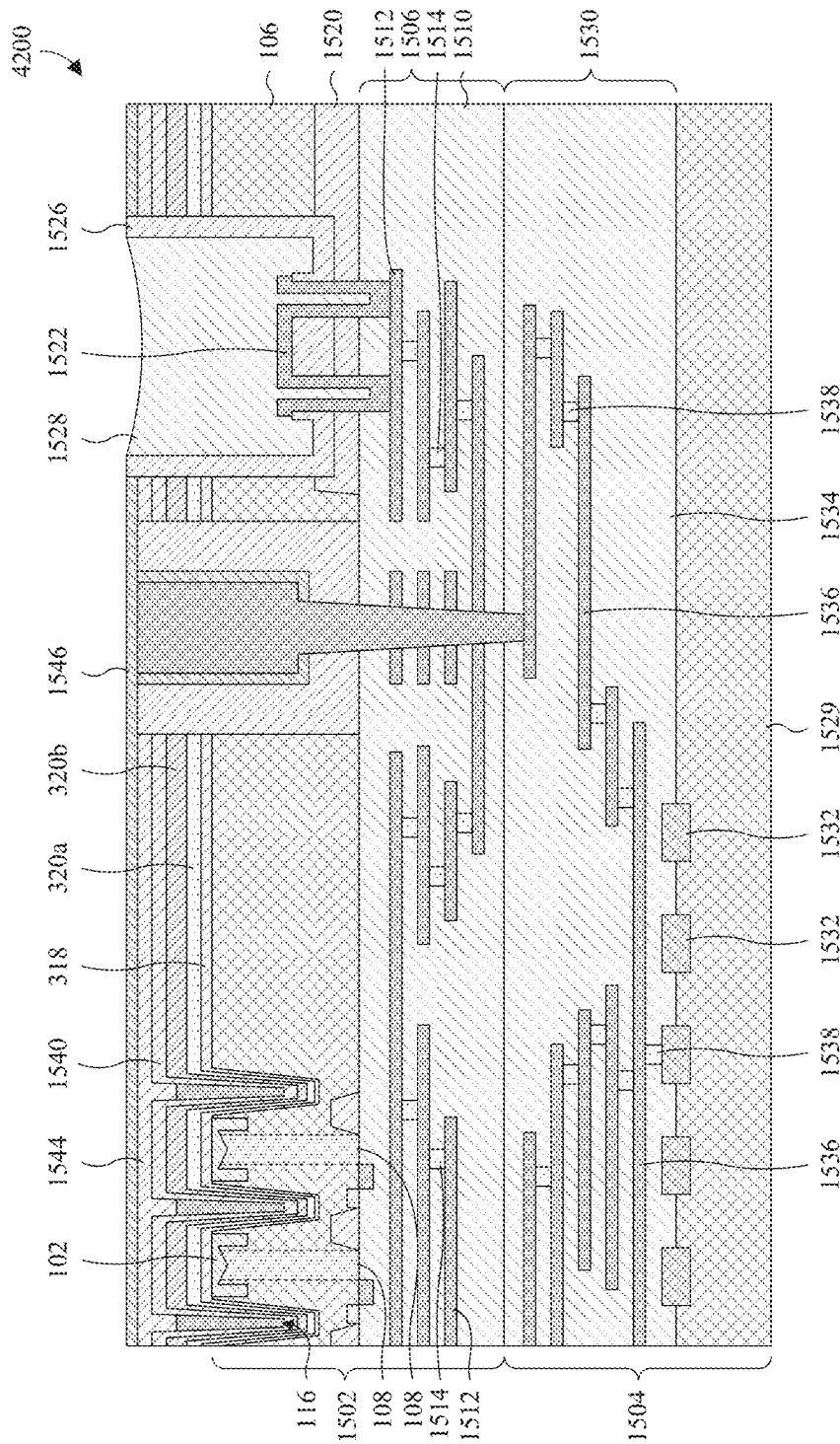

As illustrated by the cross-sectional view 4200 of FIG. 42, the pad dielectric layer 1528 and the pad dielectric liner 1526 are recessed until localized to the first pad opening 3802 (see FIG. 39). The recessing may, for example, be performed by a planarization and/or an etch back. The planarization may, for example, be performed by a CMP and/or some other suitable planarization process. The patterning at FIG. 41 may, for example, reduce CMP loading when the recessing is at least partially performed by a CMP.

Figure 43:
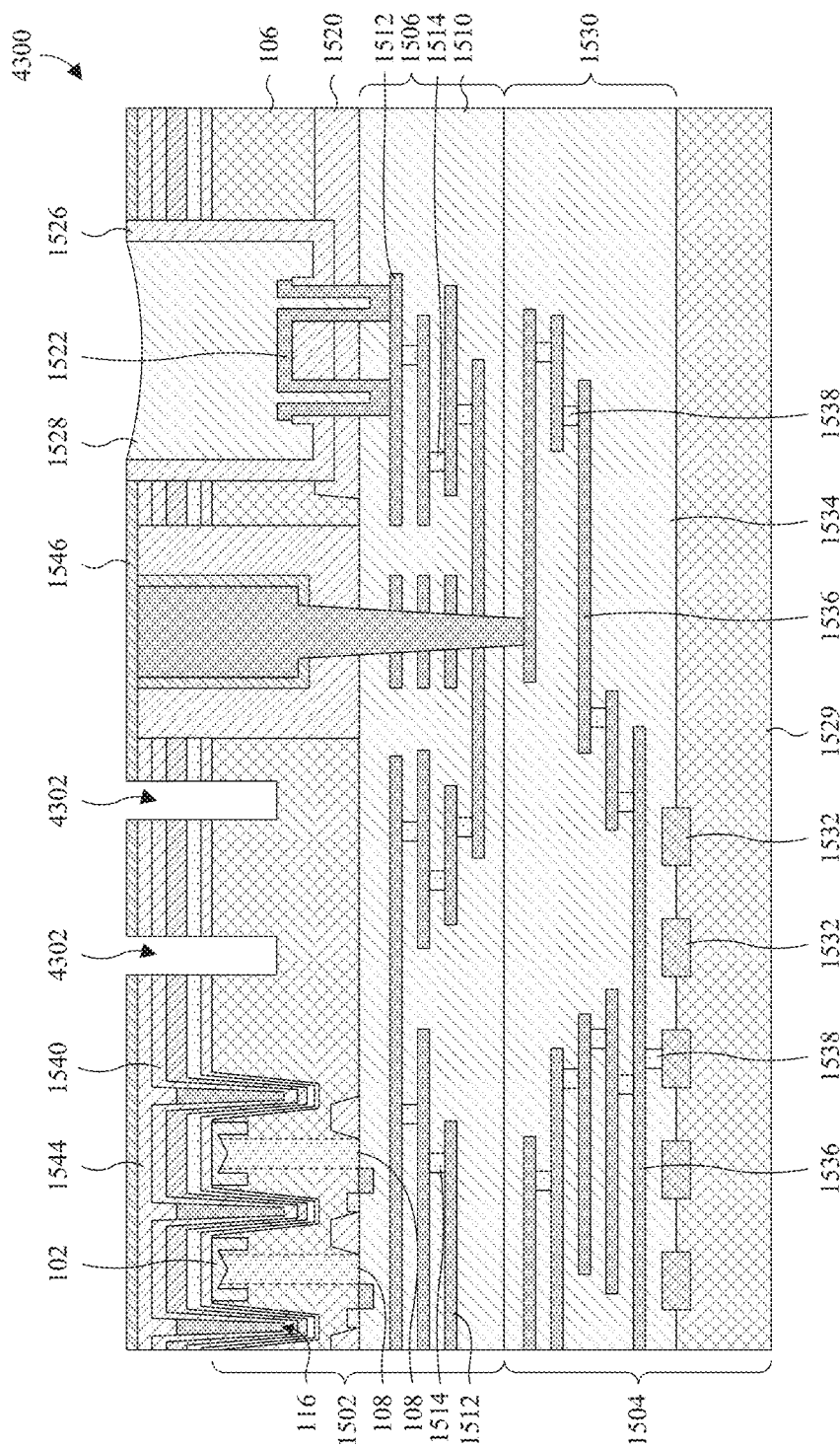

As illustrated by the cross-sectional view 4300 of FIG. 43, a patterning process is performed on the backside of the first substrate 106 to form ground openings 4302 exposing the first substrate 106. The patterning may, for example, be performed by a photolithography/etching process or some other suitable patterning process.

Figure 44:
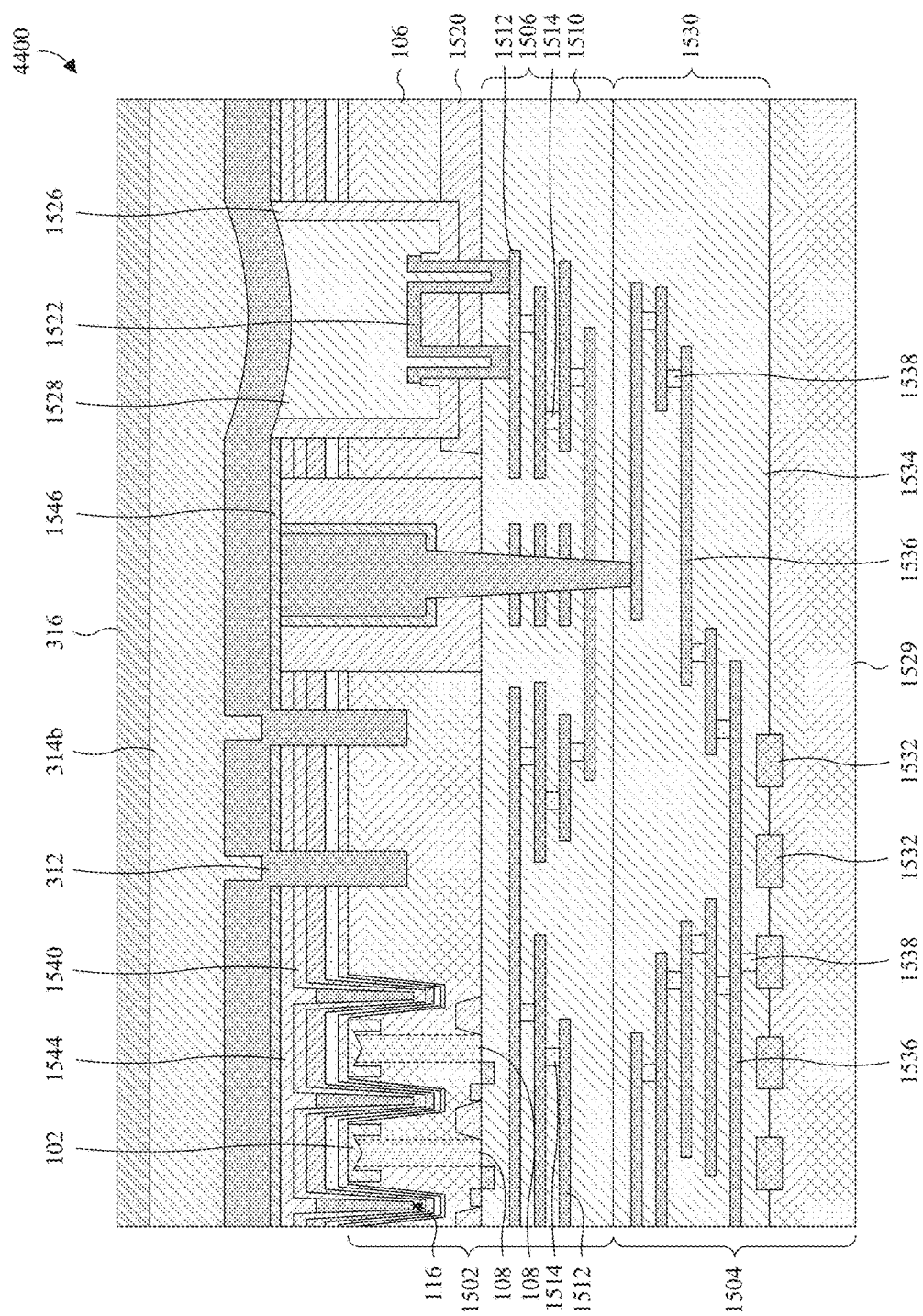

As illustrated by the cross-sectional view 4400 of FIG. 44, a metal layer 312 is formed over the etch stop layer 1546, the pad dielectric layer 1528, and the pad dielectric liner 1526, and further filling the ground openings 4302 (see FIG. 43). Also, a backside dielectric layer 314*b* and a hard mask layer 316 are formed stacked over the metal layer 312.

Figure 45:
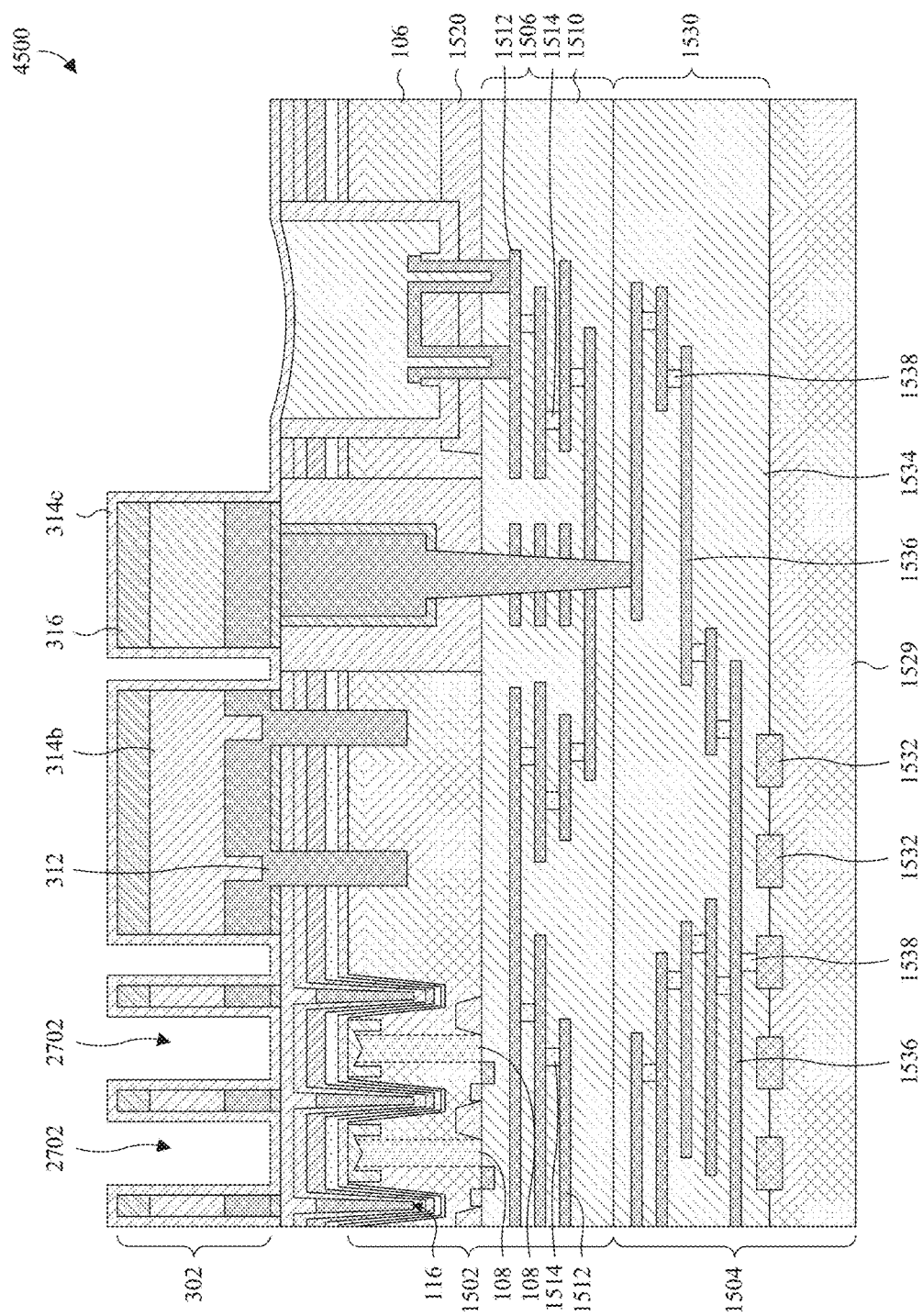

As illustrated by the cross-sectional view 4500 of FIG. 45, the metal layer 312, the backside dielectric layer 314*b*, and the hard mask layer 316 are patterned to form a composite grid 302 defining color filter openings 2702. The patterning may, for example, be performed by a photolithography/etching process or some other suitable patterning process. Also, a composite grid liner 314*c* is formed lining the composite grid 302.

Figure 46:
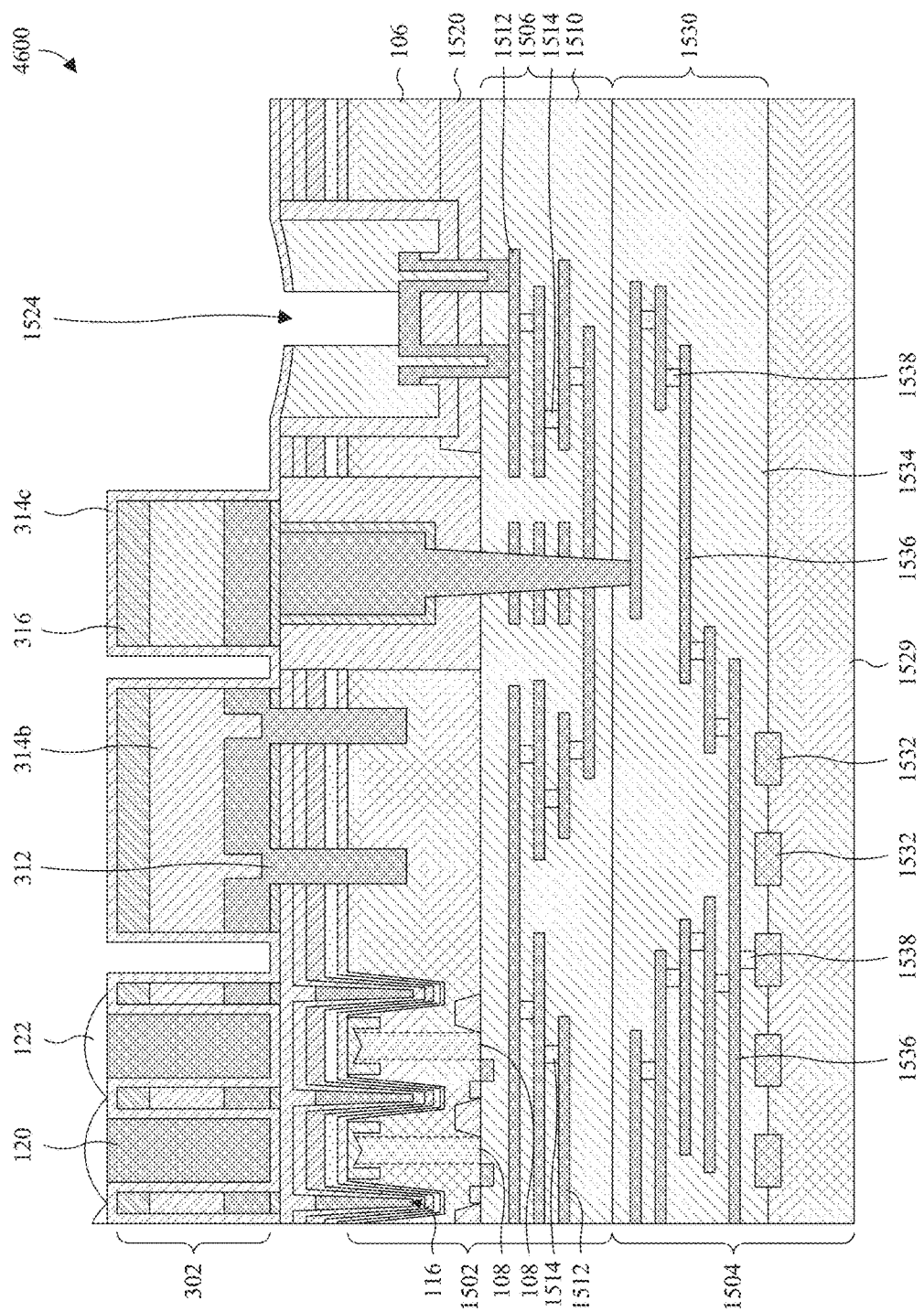

As illustrated by the cross-sectional view 4600 of FIG. 46, the pad dielectric layer 1528 and the composite grid liner 314*c* are patterned to form a second pad opening 1524. The patterning may, for example, be performed by a photolithography/etching process or some other suitable patterning process. Further, color filters 120 are formed in the color filter openings 2702 (see FIG. 45) and microlenses 122 are formed on the color filters 120.

Although the cross-sectional views 3000-4600 shown in FIGS. 30-46 are described with reference to a method, it will be appreciated that the structures shown in FIGS. 30-46 are not limited to the method but rather may stand alone separate of the method. Although FIGS. 30-46 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

In some embodiments, the present application provides an image sensor including: a substrate; a first trench isolation structure extending into a backside of the substrate to a first depth and including a pair of first trench isolation segments; a photodetector in the substrate, between and bordering the first trench isolation segments; a second trench isolation structure between the first trench isolation segments, wherein the second trench isolation structure extends into the backside of the substrate to a second depth less than the first depth and includes a pair of second trench isolation segments; and an absorption enhancement structure overlying the photodetector and between the second trench isolation segments, wherein the absorption enhancement structure is recessed into the backside of the substrate. In some embodiments, the absorption enhancement structure adjoins the second trench isolation structure, wherein a bottom surface of the absorption enhancement structure is flat and extends from one of the second trench isolation segments to another one of the second trench isolation segments. In some embodiments, the absorption enhancement structure has slanted sidewalls. In some embodiments, the absorption enhancement structure is spaced from the second trench isolation structure and has a triangular profile. In some embodiments, the absorption enhancement structure overlaps with the second trench isolation structure and has a downward protrusion with a triangular profile. In some embodiments, the absorption enhancement structure and the second trench isolation structure include a dielectric material with a refractive index less than that of the substrate. In some embodiments, the second trench isolation structure has top layout that is a square ring shaped. In some embodiments, the second trench isolation structure has a top layout that is cross shaped. In some embodiments, the absorption enhancement structure has a top layout that is square or diamond shaped.

In some embodiments, the present application provides an image sensor including: a substrate; a trench isolation structure extending into a backside surface of the substrate to a first depth and including a pair of trench isolation segments; a photodetector in the substrate, between and next to the trench isolation segments; and a dielectric structure on the backside surface of the substrate, wherein the dielectric structure protrudes into the backside surface to a second depth less than the first depth, and wherein the dielectric structure has slanted sidewalls that overlie the photodetector and slant from the backside surface to a midpoint between the backside surface and the second depth. In some embodiments, a width of the dielectric structure decreases from the backside surface of the substrate to the midpoint and is substantially uniform from the midpoint to the second depth. In some embodiments, a bottom profile of the dielectric structure is M shaped. In some embodiments, the slanted sidewalls meet at the midpoint. In some embodiments, the dielectric structure has a ring-shaped portion surrounding the slanted sidewalls and overlying the photodetector, wherein the ring-shaped portion has the second depth.

In some embodiments, the present application provides a method for forming an image sensor, the method including: forming a photodetector in a substrate; performing a first etch into a backside of the substrate to form an absorption enhancement opening (AEO) overlying the photodetector and having slanted sidewalls; performing a second etch into the backside of the substrate to form a first isolation trench (FIT) bordering the AEO; performing a third etch into the backside of the substrate to form a second isolation trench (SIT) extending into the backside of the substrate to a greater depth than the FIT, and wherein the SIT includes opposing segments between which the photodetector, the AEO, and the FIT are sandwiched; and filling the AEO, the FIT, and the SIT with a dielectric material. In some embodiments, the AEO has a triangular profile, and wherein the FIT has a top layout that is square ring shaped. In some embodiments, the second etch is performed into the substrate through the AEO, such that the AEO and the FIT overlap. In some embodiments, the AEO and the SIT have top layouts that are square and/or diamond shaped. In some embodiments, the absorption enhancement opening has an isosceles-trapezoid profile upon completion of the first etch. In some embodiments, the filling includes: depositing a dielectric layer in the AEO, the FIT, and the SIT, and further covering the backside of the substrate, wherein the dielectric layer includes the dielectric material; and performing a planarization into the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a substrate;
   a first trench isolation structure extending into a backside of the substrate to a first depth and comprising a pair of first trench isolation segments;
   a photodetector in the substrate, between and bordering the first trench isolation segments;
   a second trench isolation structure between the first trench isolation segments, wherein the second trench isolation structure extends into the backside of the substrate to a second depth less than the first depth and comprises a pair of second trench isolation segments; and
   an absorption enhancement structure overlying the photodetector and between the second trench isolation segments, wherein the absorption enhancement structure is recessed into the backside of the substrate, and wherein sidewalls of the absorption enhancement structure directly contact the second trench isolation structure.

2. The image sensor according to claim 1, wherein a bottom surface of the absorption enhancement structure is flat and extends from one of the second trench isolation segments to another one of the second trench isolation segments.

3. The image sensor according to claim 1, wherein the absorption enhancement structure has slanted sidewalls.

4. The image sensor according to claim 1, wherein the absorption enhancement structure has a triangular profile.

5. The image sensor according to claim 1, wherein the absorption enhancement structure overlaps with the second trench isolation structure and has a downward protrusion with a triangular profile.

6. The image sensor according to claim 1, wherein the absorption enhancement structure and the second trench isolation structure comprise a dielectric material with a refractive index less than that of the substrate.

7. The image sensor according to claim 1, wherein the second trench isolation structure has top layout that is a square ring shaped.

8. The image sensor according to claim 1, wherein the second trench isolation structure has a top layout that is cross shaped.

9. The image sensor according to claim 1, wherein the absorption enhancement structure has a top layout that is square or diamond shaped.

10. An image sensor comprising:
    a substrate;
    a first trench isolation structure extending into a backside surface of the substrate to a first depth and comprising a pair of first trench isolation segments;
    a photodetector in the substrate, between and next to the first trench isolation segments; and
    a dielectric structure on the backside surface of the substrate, wherein the dielectric structure protrudes into the backside surface to a second depth less than the first depth, wherein the dielectric structure has a pair of slanted sidewalls that slant from the backside surface to a midpoint between the backside surface and the second depth, wherein one of the slanted sidewalls extends downward from one of the first trench isolation segments to the midpoint, wherein another one of the slanted sidewalls extends downward from another one of the first trench isolation segments to the midpoint, such that the slanted sidewalls meet at the midpoint, and wherein the midpoint directly overlies the photodetector.

11. A method for forming an image sensor, the method comprising:
    forming a photodetector in a substrate;
    performing a first etch into a backside of the substrate to form an absorption enhancement opening (AEO) overlying the photodetector and having slanted sidewalls;
    performing a second etch into the backside of the substrate to form a first isolation trench (FIT) bordering the AEO;
    performing a third etch into the backside of the substrate to form a second isolation trench (SIT) extending into the backside of the substrate to a greater depth than the FIT, and wherein the SIT comprises opposing segments between which the photodetector, the AEO, and the FIT are sandwiched, such that the SIT is laterally separated from the AEO and the slanted sidewalls of the AEO directly contact sidewalls of the FIT; and
    filling the AEO, the FIT, and the SIT with a dielectric material.

12. The method according to claim 11, wherein the AEO has a triangular profile, and wherein the FIT has a top layout that is square ring shaped.

13. The method according to claim 11, wherein the second etch is performed into the substrate through the AEO, such that the AEO and the FIT overlap.

14. The method according to claim 13, wherein the AEO and the SIT have top layouts that are square and/or diamond shaped.

15. The method according to claim 11, wherein the absorption enhancement opening has an isosceles-trapezoid profile upon completion of the first etch.

16. The method according to claim 11, wherein the filling comprises:
- depositing a dielectric layer in the AEO, the FIT, and the SIT, and further covering the backside of the substrate, wherein the dielectric layer comprises the dielectric material; and
- performing a planarization into the dielectric layer.

17. The image sensor according to claim 10, further comprising:
- a second trench isolation structure extending into the backside surface of the substrate to a third depth greater than the first and second depths, wherein the second trench isolation structure comprises a pair of second trench isolation segments, and wherein the second trench isolation structure is laterally separated from the first trench isolation structure and the photodetector.

18. The image sensor according to claim 10, wherein a width of the dielectric structure decreases from the backside surface of the substrate to the midpoint, and wherein the midpoint is at the second depth.

19. The image sensor according to claim 10, wherein a bottom surface of the dielectric structure and inner sidewalls of the first trench isolation structure define an M shaped profile.

20. The image sensor according to claim 10, wherein the first trench isolation structure is ring-shaped and surrounds the slanted sidewalls.

* * * * *